(12) United States Patent
Seol et al.

(10) Patent No.: US 9,640,545 B2
(45) Date of Patent: *May 2, 2017

(54) NON-VOLATILE MEMORY DEVICES INCLUDING VERTICAL NAND CHANNELS AND METHODS OF FORMING THE SAME

(71) Applicant: Samsung Electronics Co., Ltd., Suwon-si, Gyeonggi-do (KR)

(72) Inventors: Kwang Soo Seol, Yongin-si (KR); Sukpil Kim, Yongin-si (KR); Yoondong Park, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/171,074

(22) Filed: Feb. 3, 2014

(65) Prior Publication Data

US 2014/0145255 A1 May 29, 2014

Related U.S. Application Data

(63) Continuation of application No. 12/701,246, filed on Feb. 5, 2010, now Pat. No. 8,644,046.

(30) Foreign Application Priority Data

Feb. 10, 2009 (KR) .................. 10-2009-0010546

(51) Int. Cl.
*H01L 27/11556* (2017.01)
*H01L 27/11551* (2017.01)
*G11C 16/04* (2006.01)
*H01L 27/11519* (2017.01)

(52) U.S. Cl.
CPC .... *H01L 27/11551* (2013.01); *G11C 16/0408* (2013.01); *H01L 27/11519* (2013.01); *H01L 27/11556* (2013.01)

(58) Field of Classification Search
CPC ................................. H01L 27/11553
USPC ........................................... 365/51
See application file for complete search history.

(56) References Cited

U.S. PATENT DOCUMENTS

| | | | |
|---|---|---|---|
| 6,188,629 B1 | 2/2001 | Kaplinsky | 365/230.03 |
| 6,815,805 B2 | 11/2004 | Weimer | |
| 7,365,388 B2 | 4/2008 | Bhattacharyya | |
| 7,714,378 B2 | 5/2010 | Kim et al. | |
| 7,871,891 B2 | 1/2011 | Cho et al. | 438/386 |
| 7,977,733 B2 | 7/2011 | Shiino et al. | |
| 8,314,455 B2 | 11/2012 | Shiino et al. | |
| 8,614,917 B2 | 12/2013 | Shim et al. | |

(Continued)

FOREIGN PATENT DOCUMENTS

| | | |
|---|---|---|
| CN | 1913132 A | 2/2007 |
| JP | 06-237003 | 8/1994 |

(Continued)

OTHER PUBLICATIONS

H. Tanaka et al, "Bit cost Scalable Technology with Punch and Plug Process for Ultra High Density Flash Memory", 2007 Symposium on VLSI Technology Digest Technical Papers, p. 14-15.

*Primary Examiner* — Min Huang
(74) *Attorney, Agent, or Firm* — Myers Bigel, P.A.

(57) ABSTRACT

A non-volatile memory device can include a plurality of immediately adjacent offset vertical NAND channels that are electrically coupled to a single upper select gate line or to a single lower select gate line of the non-volatile memory device.

19 Claims, 48 Drawing Sheets

(56) References Cited

U.S. PATENT DOCUMENTS

| | | | |
|---|---|---|---|
| 8,644,046 B2 * | 2/2014 | Seol et al. | 365/51 |
| 8,743,614 B2 | 6/2014 | Shim et al. | |
| 2006/0146608 A1 | 7/2006 | Fasoli et al. | |
| 2006/0270149 A1 | 11/2006 | Lee | 438/243 |
| 2007/0034955 A1 * | 2/2007 | Kim et al. | 257/349 |
| 2008/0067583 A1 | 3/2008 | Kidoh et al. | 257/326 |
| 2008/0068888 A1 | 3/2008 | Kim et al. | 365/185.11 |
| 2008/0123425 A1 | 5/2008 | Lutze et al. | 365/185.17 |
| 2008/0173928 A1 | 7/2008 | Arai et al. | |
| 2008/0242034 A1 * | 10/2008 | Mokhlesi et al. | 438/287 |
| 2008/0315296 A1 | 12/2008 | Tanaka et al. | |
| 2009/0080245 A1 | 3/2009 | Lutze et al. | 365/185.02 |
| 2009/0097309 A1 * | 4/2009 | Mizukami | G11C 5/02 365/184 |
| 2009/0121271 A1 | 5/2009 | Son et al. | |
| 2009/0268522 A1 * | 10/2009 | Maejima | G11C 5/02 365/185.11 |
| 2009/0310425 A1 | 12/2009 | Sim et al. | |
| 2010/0171162 A1 | 7/2010 | Katsumata et al. | |
| 2010/0270593 A1 | 10/2010 | Lung et al. | 257/208 |
| 2011/0019486 A1 | 1/2011 | Jang et al. | 365/185.25 |
| 2011/0092033 A1 | 4/2011 | Arai et al. | |
| 2013/0037860 A1 | 2/2013 | Jang | 257/211 |

FOREIGN PATENT DOCUMENTS

| | | |
|---|---|---|
| JP | 2007-180389 | 7/2007 |
| JP | 2007-266143 | 10/2007 |
| JP | 2008-159699 | 7/2008 |
| JP | 2008-171838 | 7/2008 |
| JP | 2008-171968 | 7/2008 |
| JP | 2009-004517 | 1/2009 |
| JP | 2009224574 A | 10/2009 |
| JP | 2010-161132 | 7/2010 |
| KR | 1020050110785 | 11/2005 |
| KR | 1020070036525 | 4/2007 |
| KR | 2010-0091900 A | 8/2010 |
| KR | 2011-0037470 A | 4/2011 |

* cited by examiner

NON-VOLATILE MEMORY DEVICES INCLUDING VERTICAL NAND CHANNELS AND METHODS OF FORMING THE SAME

CROSS-REFERENCE TO RELATED APPLICATION

This application is a continuation application of U.S. patent application Ser. No. 12/701,246, filed Feb. 5, 2010, which claims priority to Korean Patent Application 10-2009-0010546, filed on Feb. 10, 2009, in the Korean Intellectual Property Office, the disclosure of which is incorporated by reference herein in its entirety.

FIELD OF THE INVENTION

The present inventive concept relates to the field of semiconductors in general, and more particularly, to method of forming semiconductor devices.

BACKGROUND

Vertical NAND channel configurations have been investigated to increase the density of non-volatile memories. One such vertical NAND channel structure is discussed in "Bit Cost Scalable Technology With Punch and Plug Process For Ultra High Density Flash Memory," by H. Tanaka et al. in Symp, on VLSI Tech. Dig., pp 14~15(2007). Meanwhile, US Patent Publication No. 2009-0121271 entitled 'Vertical-type non-volatile memory devices' discloses a vertical NAND having a metal gate and a method of the same. The disclosures of the above article and US publication are incorporated herein in their entirety.

SUMMARY

Embodiments according to the present invention can provide non-volatile memory devices including vertical NAND channels and methods of forming the same. Pursuant to these embodiments, a non-volatile memory device can include a plurality of immediately adjacent offset vertical NAND channels that are electrically coupled to a single upper select gate line or to a single lower select gate line of the non-volatile memory device. In other embodiment, a non-volatile memory device can include a plurality of immediately adjacent alternatingly offset vertical NAND channels that are electrically coupled to a single upper select gate line or to a single lower select gate line of the non-volatile memory device. In another embodiment a non-volatile memory device can include a plurality of immediately adjacent vertical NAND channels that are offset from one another in a bit line direction and that are electrically coupled to a single upper select gate line or to a single lower select gate line of the non-volatile memory device.

In some embodiments of the inventive concept, vertical NAND channels of a nonvolatile memory device can be arranged in an offset way to more closely pack the vertical NAND channels within a respective upper or lower select gate line that is used to activate those channels. For example, immediately adjacent ones of the vertical NAND channels within a particular upper select gate line can be offset from one another in the direction of the bit line that is connected to multiple upper select gate lines.

The offset of the vertical NAND channels can increase the density of the memory cells within the upper select gate line. For example, the offset in the bit line direction can allow the channels to be spaced closer to one another (in the upper select gate line direction) than would be possible if the vertical NAND channels were to be fully aligned in the upper select gate line direction.

DETAILED DESCRIPTION OF EMBODIMENTS ACCORDING TO THE INVENTIVE CONCEPT

Figure 1A:
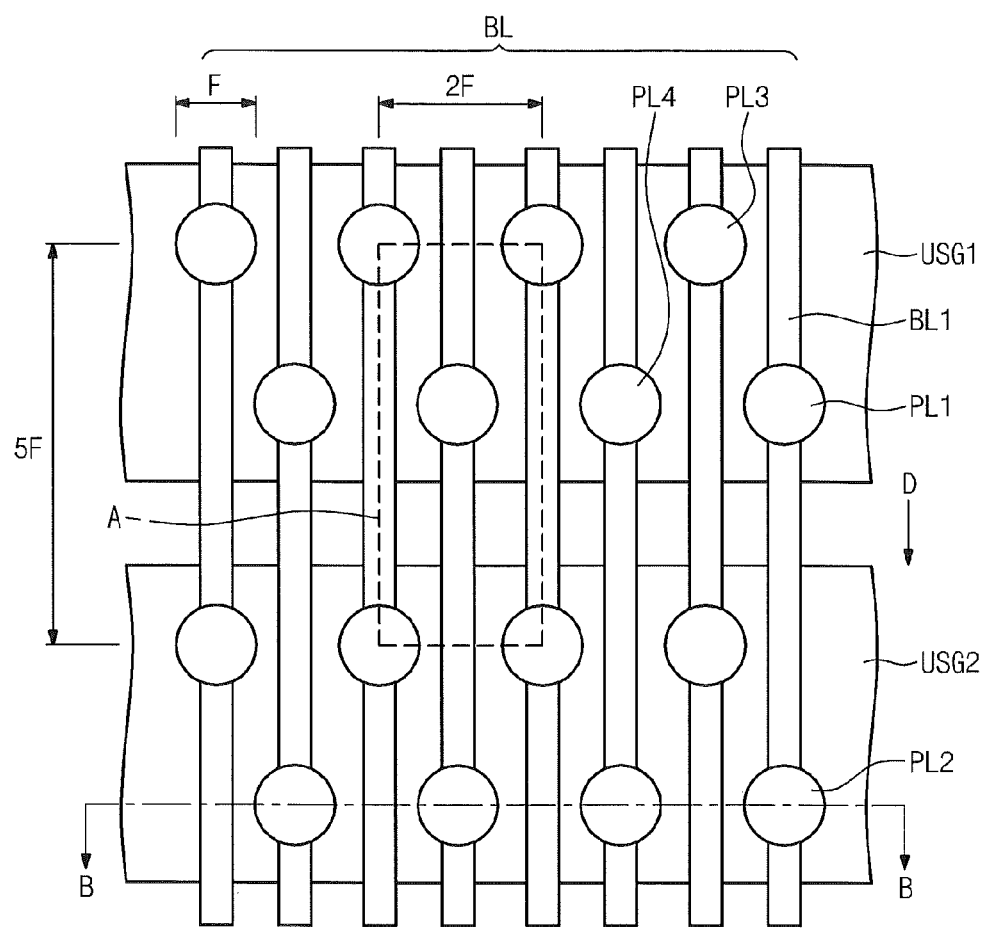
FIGS. 1A and 1B are a plan view and a cross-sectional view, respectively, illustrating nonvolatile memory devices including vertical NAND channels wherein the vertical NAND channels are alternatingly offset from one another within respective upper/lower select gate lines in some embodiments of the inventive concept.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

As described herein in greater detail, vertical NAND channels of a nonvolatile memory device can be arranged in an offset way to more closely pack the vertical NAND channels within a respective upper or lower select gate line that is used to activate those channels. For example, immediately adjacent ones of the vertical NAND channels within a particular upper select gate line can be offset from one another in the direction of the bit line that is connected to multiple upper select gate lines. In this regard, the configuration including 'an active region' where a channel is formed, a tunnel insulation layer, a charge storage layer, a block insulation layer and a conductive layer for a control gate is referred to as a 'memory string' or 'string.'

The offset of the vertical NAND channels can increase the density of the memory cells within the upper select gate line. For example, the offset in the bit line direction can allow the channels to be spaced closer to one another (in the upper select gate line direction) than would be possible if the vertical NAND channels were to be fully aligned in the upper select gate line direction.

Furthermore, the offset of the immediately adjacent vertical NAND channels can allow more channels to be activated by a single select gate line thereby increasing the page size and increasing the effective read/write performance of the device. In other words, increasing the page size (by packing more vertical NAND channels onto a single upper select gate line) can allow more data to be written to/read from the device during a single operation.

Further, many different patterns of the offset used for the immediately adjacent vertical NAND channels can be used to provide the advantages described above. For example, in some embodiments of the inventive concept, the plurality of immediately adjacent offset vertical NAND channels provides that two of the vertical NAND channels are offset in the bit line direction before the pattern repeats within the uppers select gate line. In still further embodiments of the inventive concept, three vertical NAND channels are offset in a bit line direction before the pattern repeats. Still further, in other embodiments of the inventive concept, four vertical NAND channels can be offset in the bit line direction before the pattern repeats in the upper select gate line. Other repeating patterns can be use.

In still further embodiments of the inventive concept, the pattern used to offset immediately adjacent ones of the vertical NAND channels can be repeated within an immediately adjacent upper select gate line to provide duplicates of one another. In still further embodiments of the inventive concept, the pattern employed in one of the upper select gate lines is a mirror image of the pattern used in the immediately adjacent one of the upper select gate lines. In still other embodiments of the inventive concept, the offset vertical NAND channels can be configured according to a random pattern.

In still further embodiments of the inventive concept, the offset vertical NAND channels can be arranged within separate upper select gate lines which are paired with a single common lower select gate line. In still further embodiments of the inventive concept, the offset vertical NAND channels are coupled to separate upper select gate lines which are paired within respective separate lower select gate lines.

In still further embodiments of the inventive concept, immediately adjacent ones of the upper select gate lines (in which the offset vertical NAND channels are deployed) are themselves offset from one another in a direction of the channels. In some embodiments of the inventive concept, the immediately adjacent offset vertical NAND channels are deployed within a device wherein word lines used to program immediately adjacent vertical NAND channels are separated from one another by an insulating material. In still further embodiments of the inventive concept, the word lines used to program immediately adjacent channels are coupled to a common word line. In still further embodiments of the inventive concept, the upper select gate lines employed with the offset vertical NAND channels are interdigitated with one another. In further embodiments of the inventive concept, upper select gate lines used to activate immediately adjacent ones of the vertical NAND channels are not interdigitated within one another.

Figure 1B:
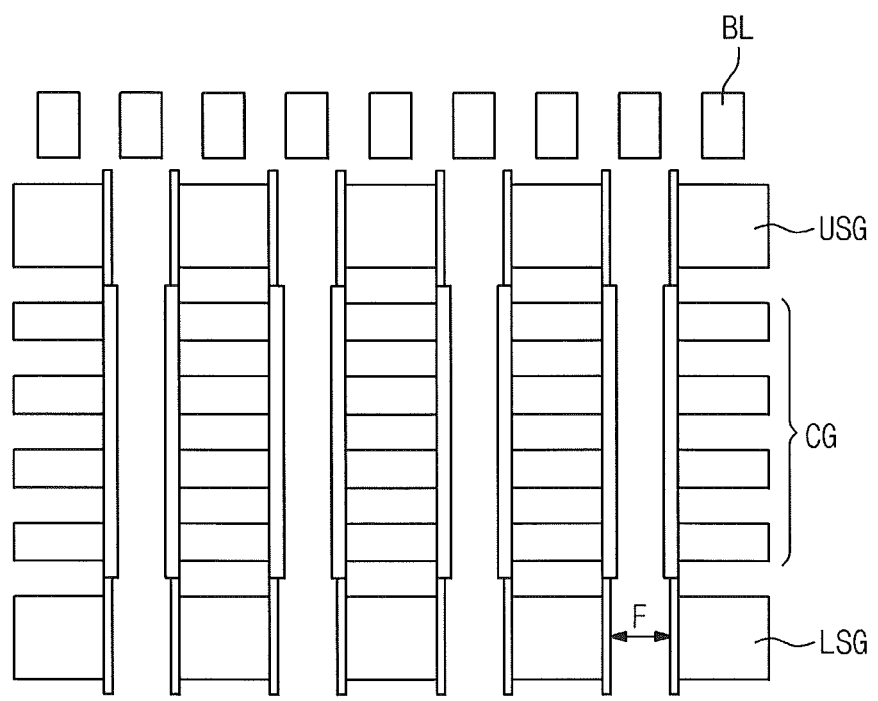

FIGS. 1A and 1B are a schematic plan view and a cross-sectional view, respectively, illustrating a plurality of immediately adjacent alternatingly offset vertical NAND channels in some embodiments of the inventive concept. According to FIG. 1A, bit lines BL extend in a direction D to cross upper select gate lines USG1 and USG2 both of which extend in a direction that is perpendicular to the direction D. Each of the bit lines BL is electrically connected to a single vertical NAND channel PL within each of the upper select gate lines USG1 and USG2. For example, the bit line BL1 extends in the direction D across the upper select gate line USG1 to electrically contact a first vertical NAND channel PL1. The bit line BL continues in the direction D to cross over the upper select gate line USG2 and to electrically contact a second vertical NAND channel PL2.

As further shown in FIG. 1A, each of the upper select gate lines USG1 and USG2 is electrically coupled to a plurality of the vertical NAND channels PL, each of which is coupled to a respective bit line BL that extends in the direction D. In some embodiments of the inventive concept, immediately adjacent ones of the vertical NAND channels PL connected to the upper select gate lines USG1 and USG2 are alternatingly offset from one another in the direction D. In particular, the channel PL1 connected to USG1 is offset from the immediately adjacent channel PL3 in the direction D. Moreover, the immediately adjacent channel PL 4 is also offset from the channel PL3. Therefore, it will be understood that the offset provided to each of the vertical NAND channels alternates to provide a zig-zag or staggered pattern of vertical NAND channels extending in the direction of the USG line USG1 which is perpendicular to the direction D.

Offsetting the immediately adjacent vertical NAND channels allows those channels to be more closely spaced to one another as the outer portions of the vertical NAND channels are immediately adjacent to the neighboring bit line, rather than the neighboring channel as is found in many conventional arrangements. As further shown in FIG. 1A, this alternating offset provided to vertical NAND channels PL can be repeated periodically. For example, the channels PL coupled to upper select gate line USG1 are offset in an alternating fashion so that each of the channels is offset from both of its immediate neighbors. Still further, this alternating pattern is repeated within upper select gate line USG1 and upper select gate line USG2. The overall effect within the nonvolatile memory device is to increase the density of the vertical NAND channels thereby increasing the density of cells, and further, allowing the upper select gate line to contact more channels to thereby increase the page size within the device. Increasing the page size within the device can, in turn, increase the effective speed of the device by allowing more data to be read from or written to the device simultaneously.

As further shown in FIG. 1B, the vertical NAND channels PL (having a width F) are arranged so the upper selected gate line USG is placed above the cells that are controlled by the control gates (CG) whereas the lower select gate line LSG is located beneath the cells controlled by the control gates.

It will be understood that in some embodiments of the inventive concept, offsetting vertical NAND channels in the bit line direction according to the configuration described herein, can allow the channels to be spaced more closely to the adjacent bit lines. For example, if a channel is of a circular type including a pillar shape or a cylindrical type including tubular type and bottomed cylindrical type viewed from the top and the width of a circle is labeled F, the effective area is defined as an average area for one channel to occupy on a top surface. Referring to FIG. 1A, the effective area for one channel will be reduced to $5F^2$ (=$2F*5F/2$ channels) for a device of the present invention having a repeating pattern of two channels while $6F^2$ (=$2F*3F/1$ channel) for a layout of a conventional vertical NAND. For a device having a repeating pattern of three channels, the required area is calculated as about 4.7 $F^2$ (=$2F*7F/3$ channels) and for a device of four channels, the required area is $4.5F^2$ (=$2F*9F/4$ channels), referring to FIG. 3A.

As such, integration of a device for example non-volatile devices such as NAND is increased. According to the present invention, the programming and reading speed is also multiplied as the page size is multiplied.

Figure 2A:
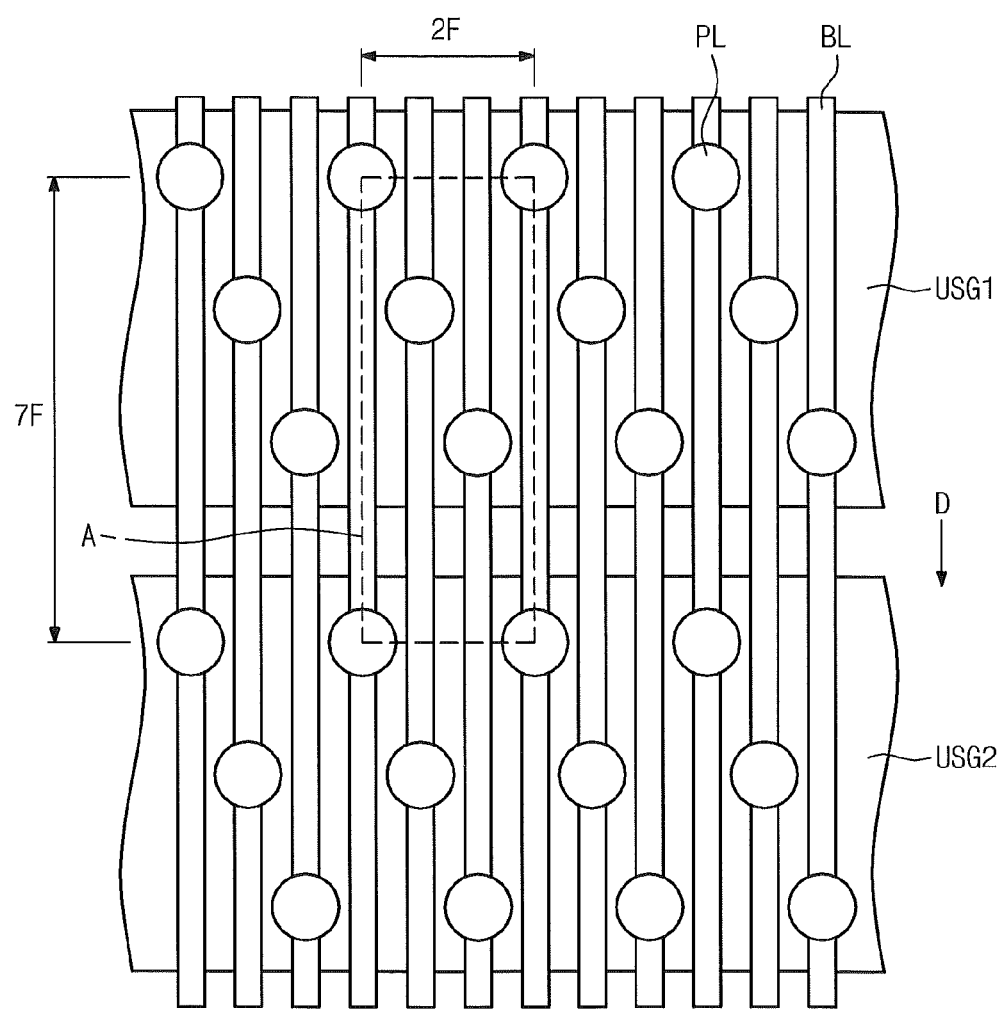
FIGS. 2A-2C are a plan view, a perspective view, and a perspective schematic view, respectively, illustrating offset vertical NAND channels coupled to respective upper/lower select gate lines having two of every three vertical NAND channels offset from one another in some embodiments of the inventive concept.
Figure 2B:
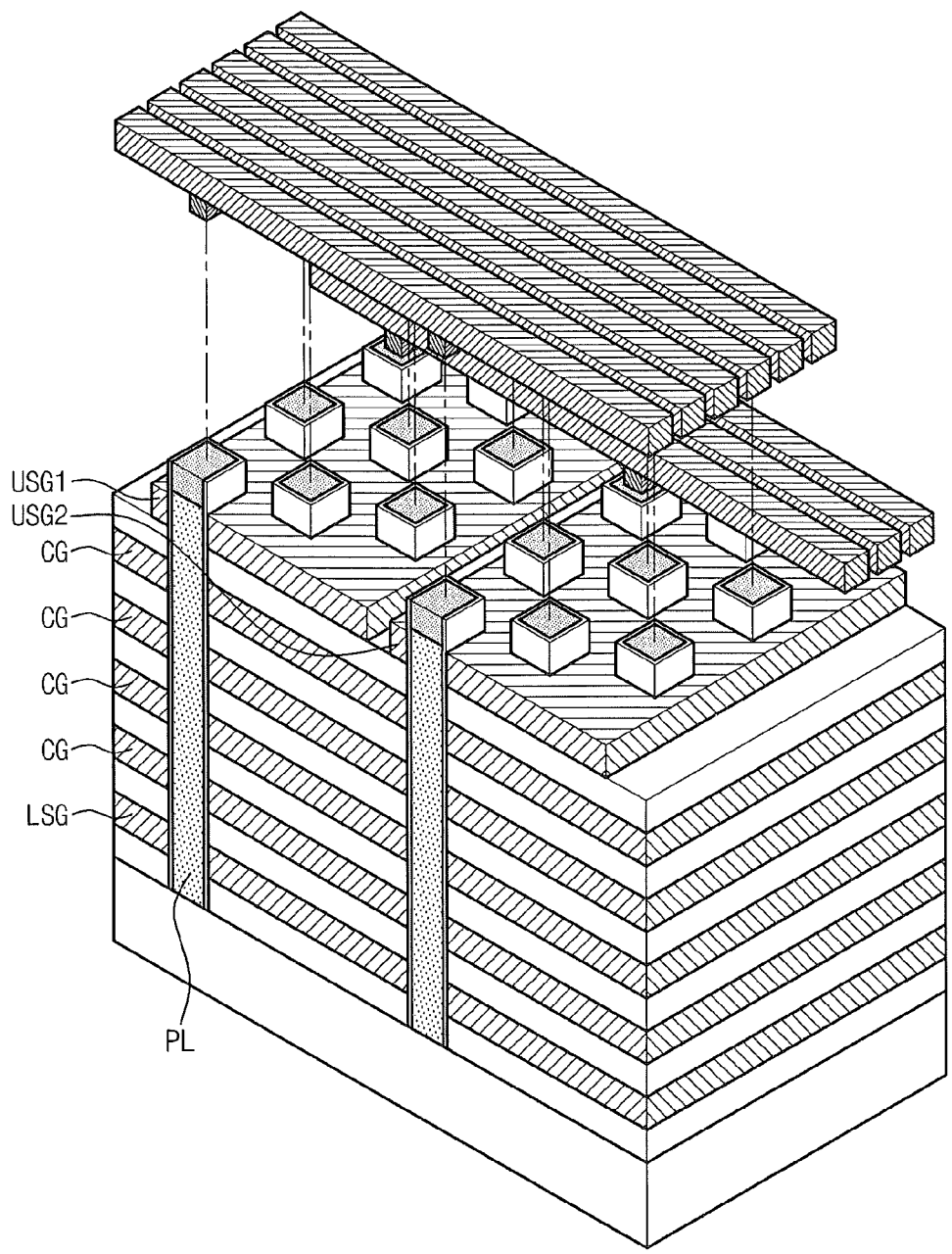
Figure 2C:
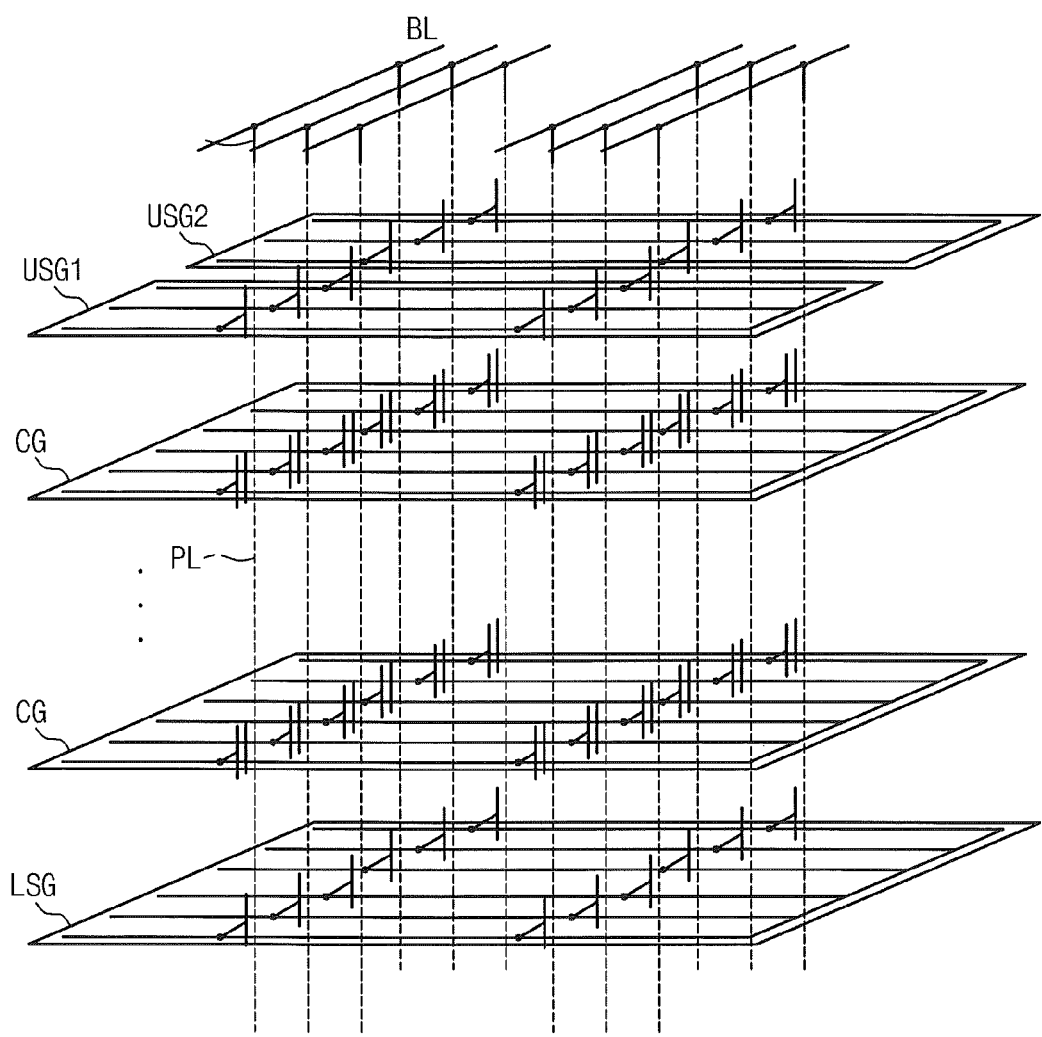

FIGS. 2A-2C are a schematic plan view, a perspective view, and a schematic perspective view of a plurality of immediately adjacent offset vertical NAND channels in some embodiments of the inventive concept. In particular, FIG. 2A illustrates a configuration wherein vertical NAND channels are offset from one another in the bit line direction D in a repeating pattern of three channels. In particular, the offset pattern repeats every third channel extending in the direction of the upper select gate lines USG1 and USG2. In other words, whereas one of the rows of channels may be considered to be aligned to one another, the other two channels within the pattern of three are offset from the initial channel so that two of the three vertical channels are offset from the aligned channel.

As further illustrated in FIGS. 2A-2C, the pattern shown therein can increase the density of cells (and the performance of the corresponding nonvolatile memory device) by increasing the number of channels within each of the upper select gate lines. Still further, FIGS. 2A-2C illustrate that the arrangements of immediately adjacent vertical NAND channels provided in both of the upper select gate lines can be symmetrical to one another such that the arrangement shown in the upper select gate line USG1 is a duplicate of that shown in upper select gate USG2.

FIGS. 3A-3E are a schematic plan view, a perspective view, a schematic perspective view, a plan view and a cross-sectional view, respectively, that illustrate still further embodiments of the inventive concept employing offset vertical NAND channels. In particular, FIGS. 3A-3E show an arrangement of four vertical NAND channels in an offset arrangement. As further shown in FIGS. 3A-3E, the separate upper select gate lines USG1 and USG2 are paired with a single common lower select gate line LSG.

Figure 3A:
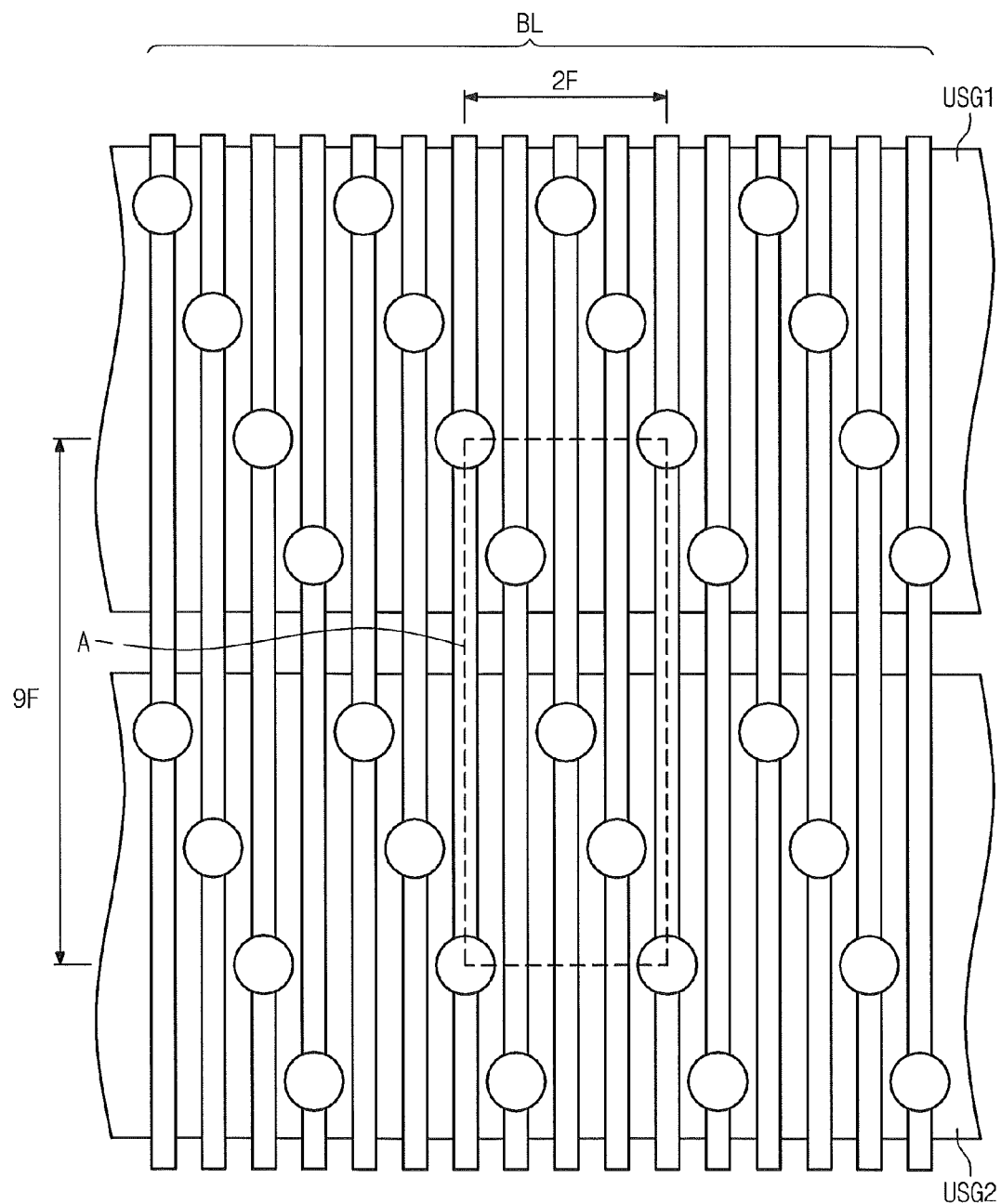
FIGS. 3A-3E are a schematic plan view, a perspective view, a perspective schematic view, a plan view, and a cross-sectional view, respectively, illustrating offset vertical NAND channels within respective upper/lower gate lines symmetrically arranged to provide duplicates of one another in some embodiments of the inventive concept.
Figure 3B:
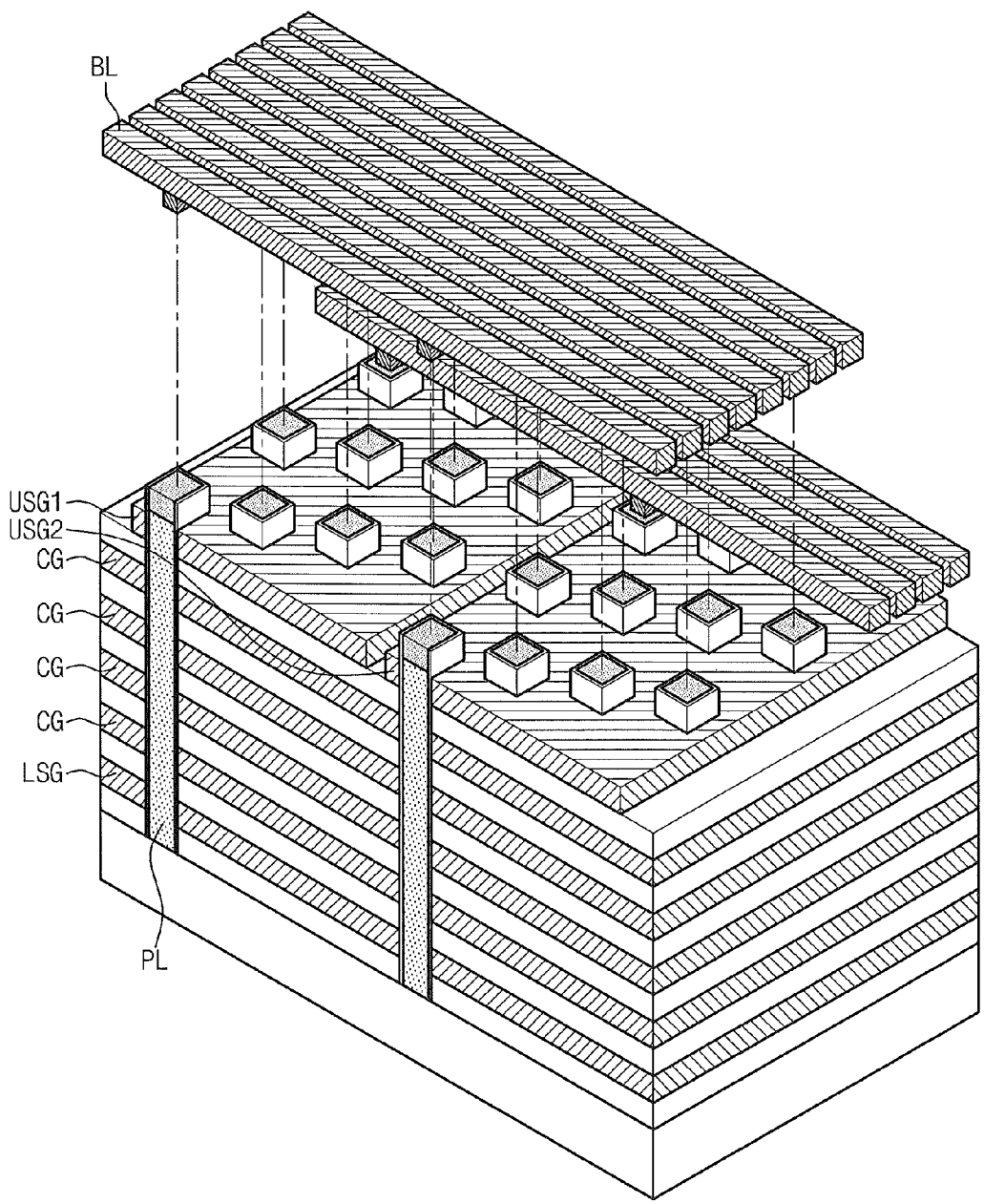
Figure 3C:
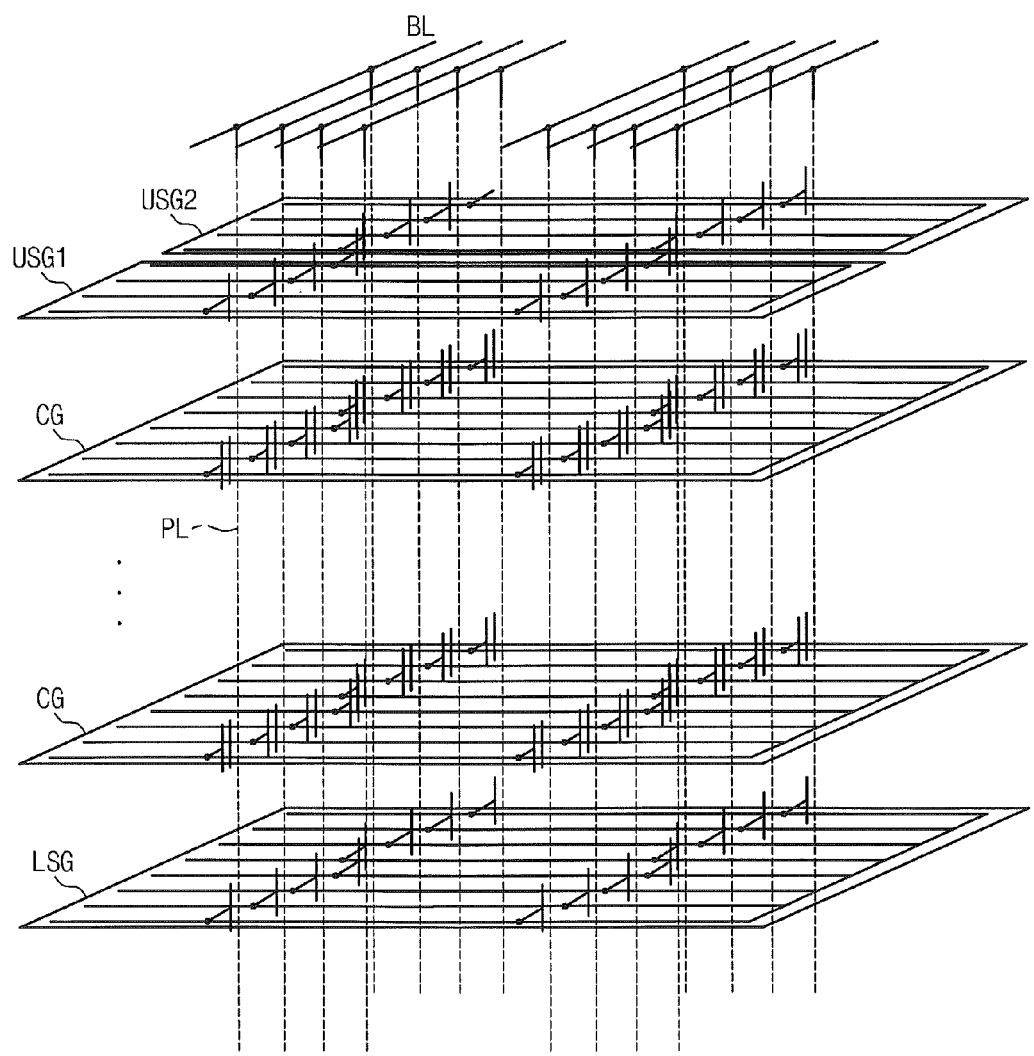
Figure 3D:
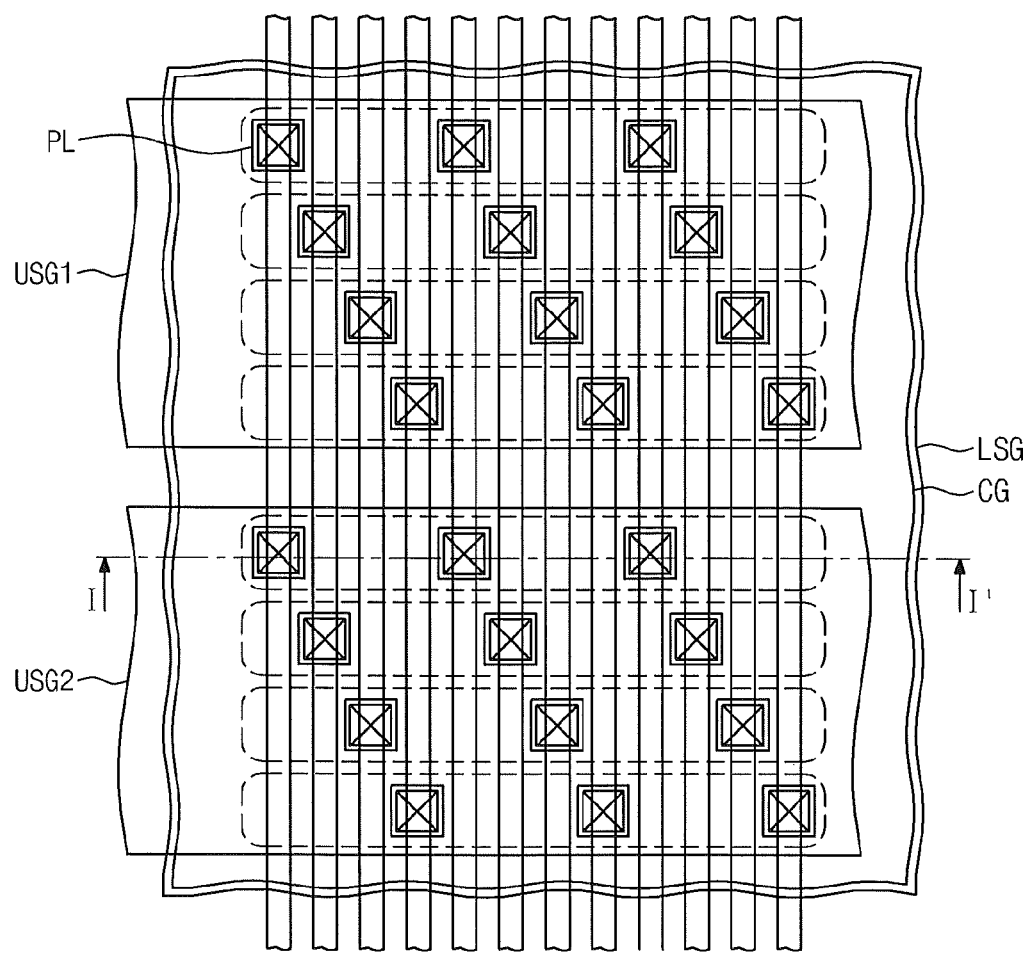
Figure 3E:
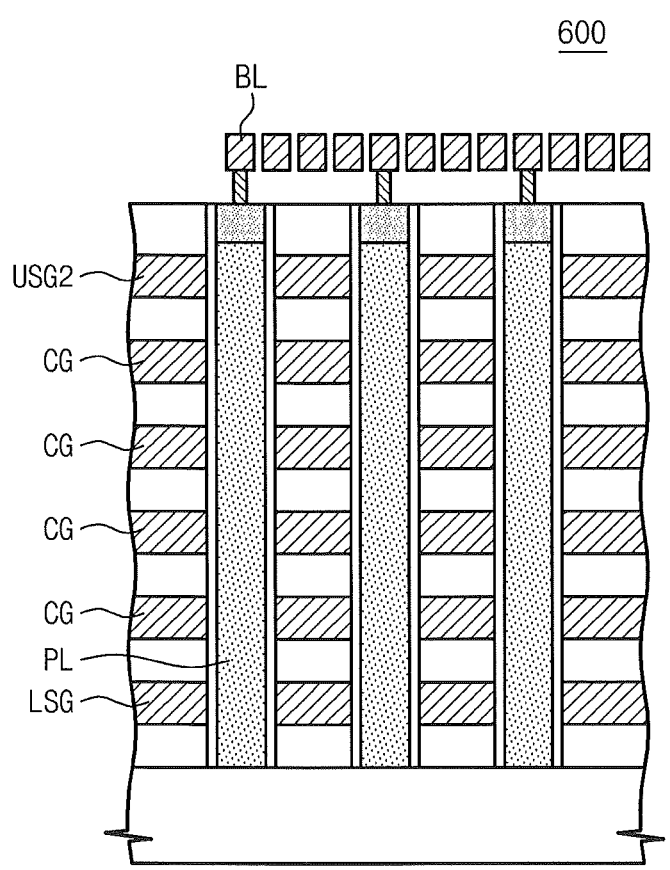

Furthermore, the arrangements shown within the upper select gate line USG1 and the upper select gate line USG2 are symmetrical so that each is a duplicate of the other. Still further, the region A is FIG. 3A illustrates that the offset applied to the immediately adjacent NAND channels can increase the density of the cells so that the four cells shown within the region A can effectively be packed into about 4 and a half of a standard channel (equal to 4.5 $F^2$ of effective area), which represents an increase in density compared to some conventional approaches.

Figure 4:
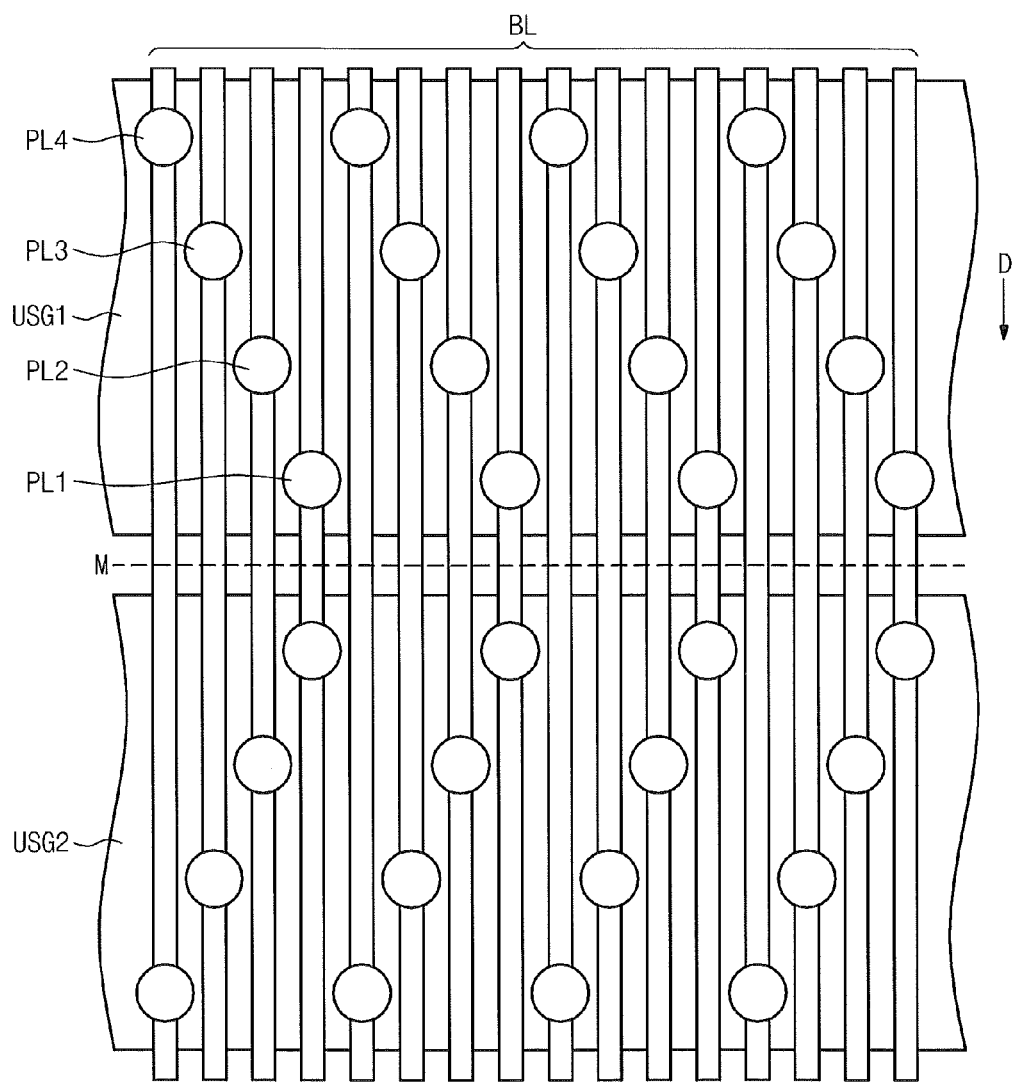
FIG. 4 is a schematic plan view illustrating offset vertical NAND channels symmetrically arranged to provide a mirror arrangement of one another in some embodiments of the inventive concept.
Figure 5A:
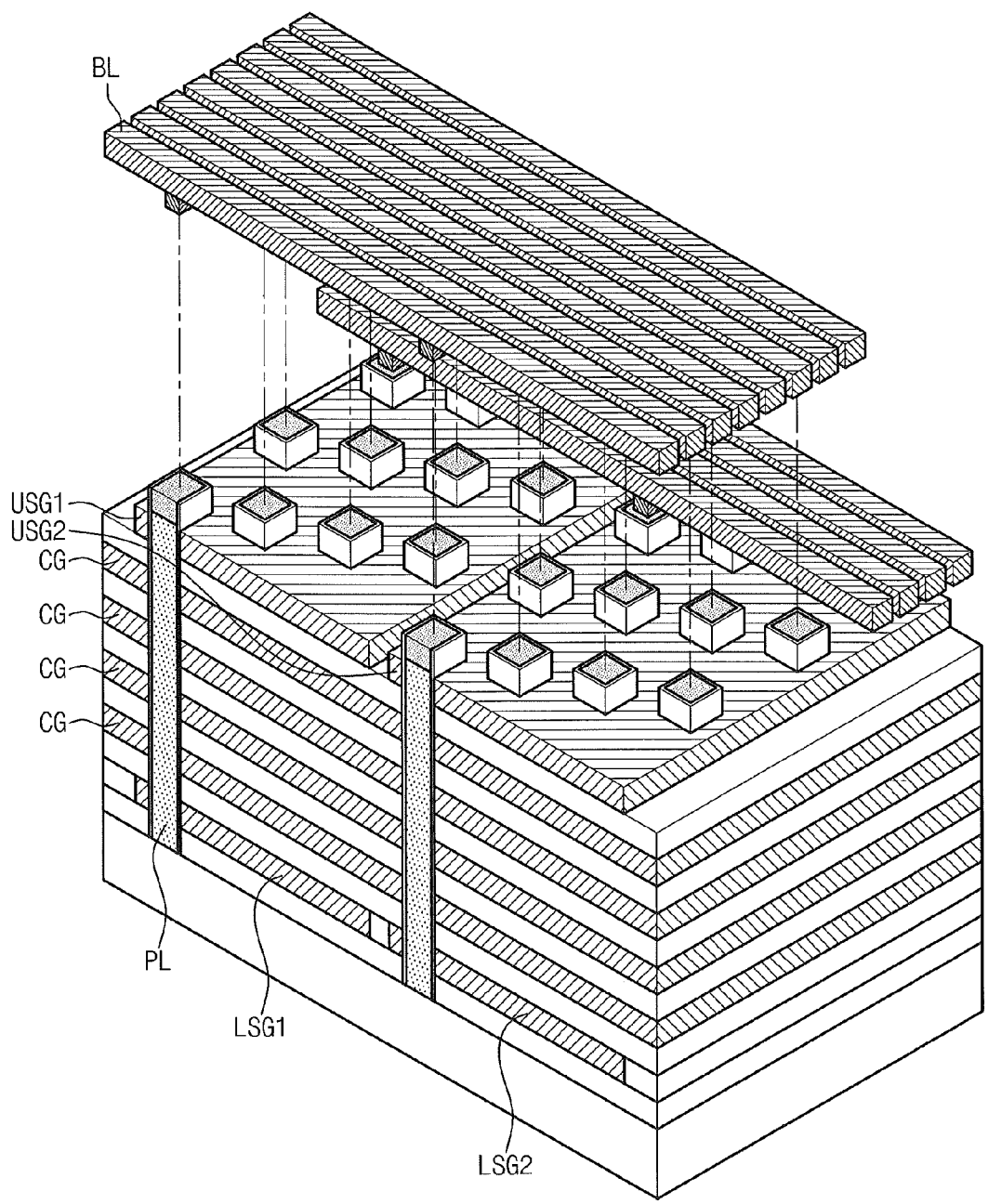
FIGS. 5A-5D are a perspective view, a schematic perspective view, a plan view, and a cross-sectional view, respectively, illustrating offset vertical NAND channels with separate lower select gate lines paired with the separate upper select gate lines in some embodiments of the inventive concept.
Figure 5B:
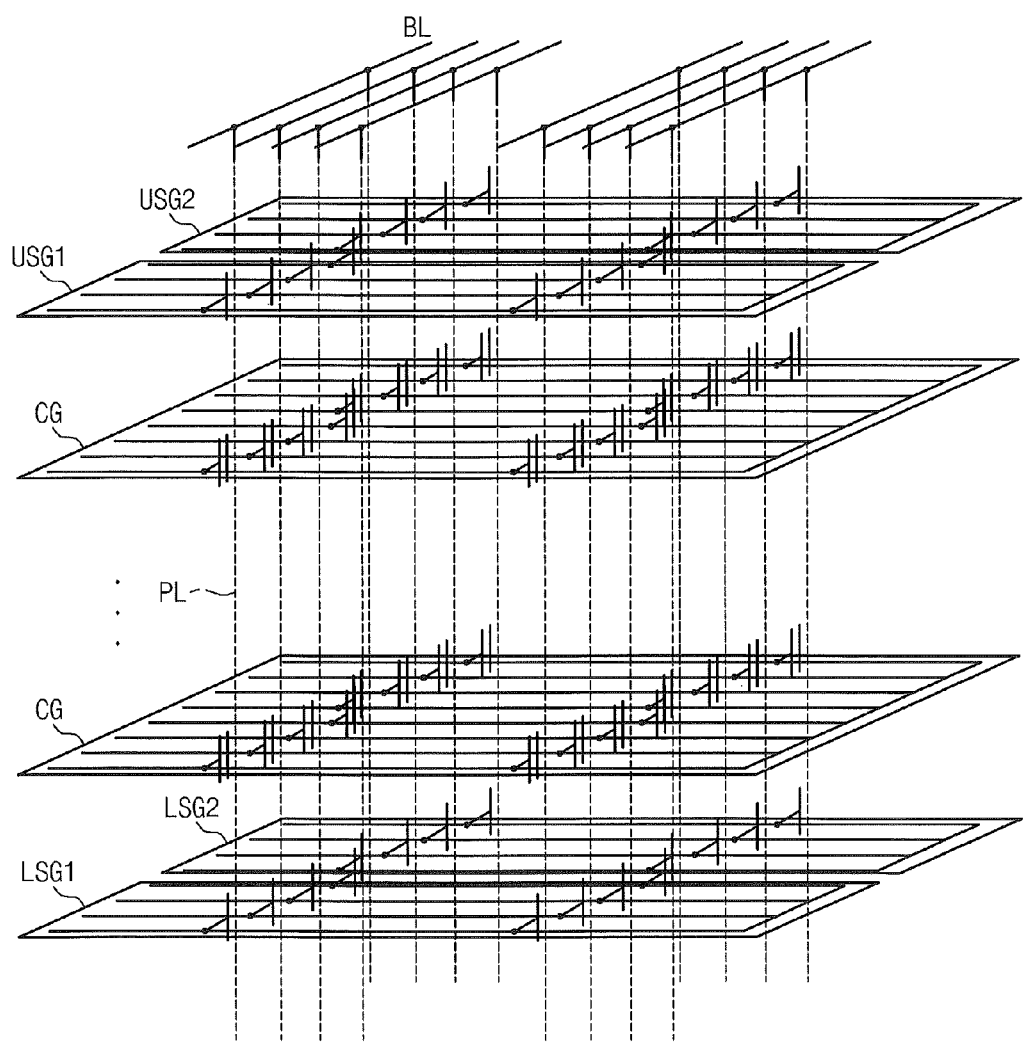
Figure 5C:
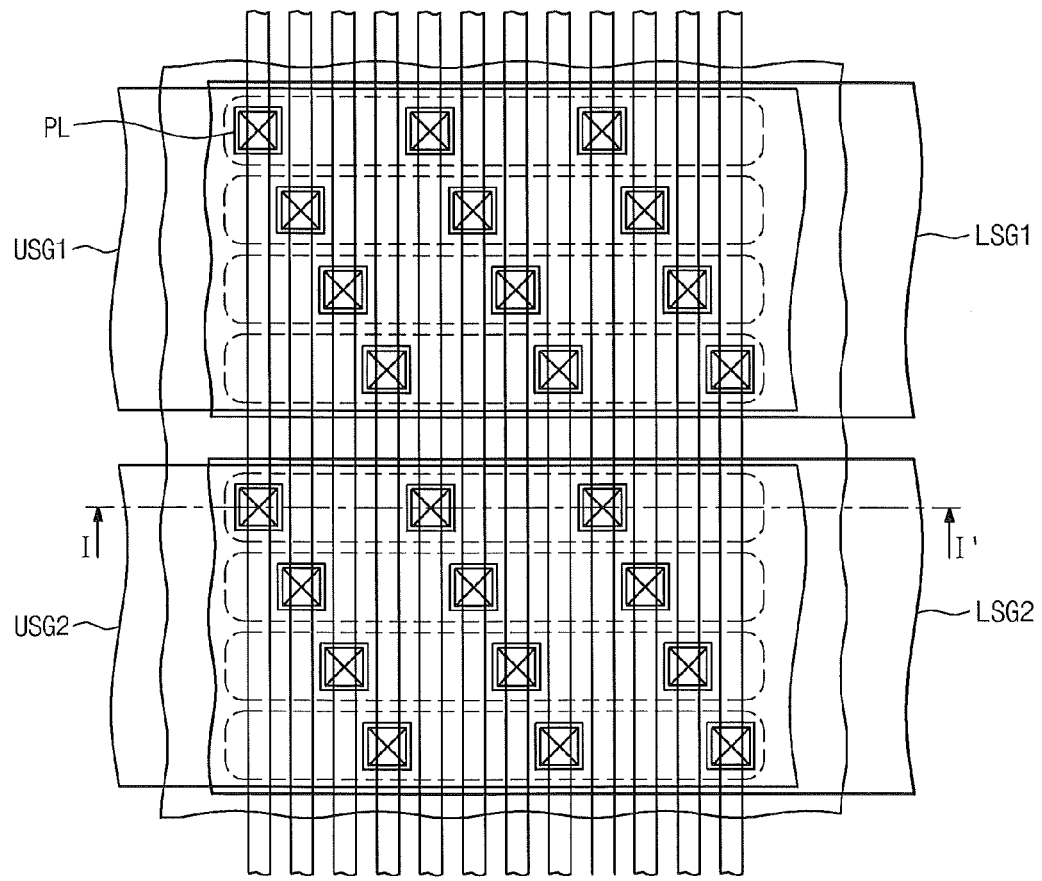
Figure 5D:
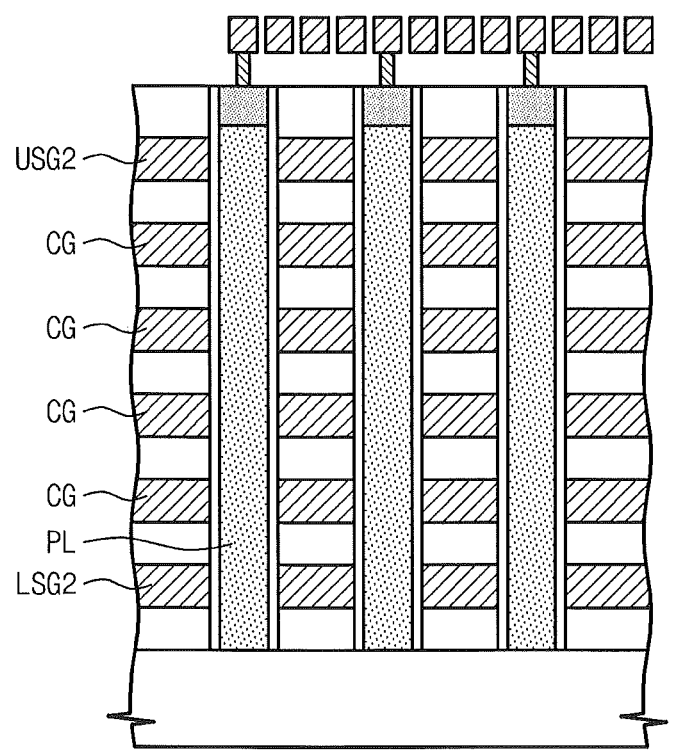

FIG. 4 is a schematic plan view of a plurality of immediately adjacent and offset vertical NAND channels according to some embodiments of the present invention. An arrangement shown in FIG. 4 utilizes a pattern of four channels that are offset from one another. In particular, channels PL1-PL4 shown coupled to upper select gate line USG 1 are each offset from one another in the bit line direction D. Furthermore, this pattern repeats in the direction which is perpendicular to the bit line direction D. Still further, the arrangements in the upper select gate line USG 1 and the upper select gate line USG 2 are mirror images of one another relative to the reference line M.

FIGS. 5A-5D are a perspective view, a schematic perspective view, a plan view, and a cross-sectional view, respectively, that illustrate the plurality of immediately adjacent offset NAND channels arranged within separate upper select gate lines paired with similarly separated lower select gate lines in some embodiments of the inventive concept and analogous to that described above in relation to FIGS. 3A-3E. However, FIGS. 5A-5D show that the plurality of offset vertical NAND channels PL are coupled to respective ones of the separate upper select gate lines USG1 and USG2 and, further, that each of those upper select gate lines USG 1 and 2 is paired with a separate lower select gate line LSG1 and LSG2.

Figure 6A:
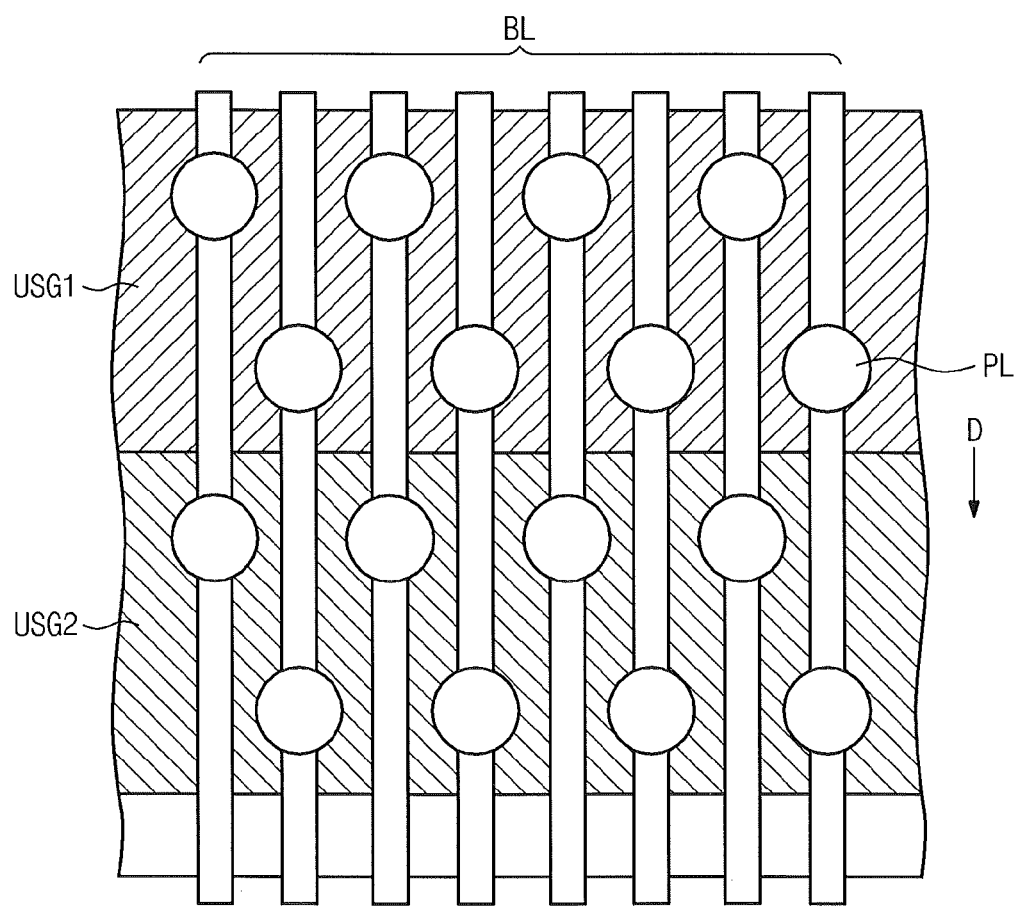
FIGS. 6A-6E are a schematic plan view, a perspective view, a schematic perspective view, a plan view and a cross-sectional view, respectively, illustrating alternatingly offset vertical NAND channels coupled to separate upper select gate lines which are offset from one another in a direction of the vertical NAND channels in some embodiments of the inventive concept.
Figure 6B:
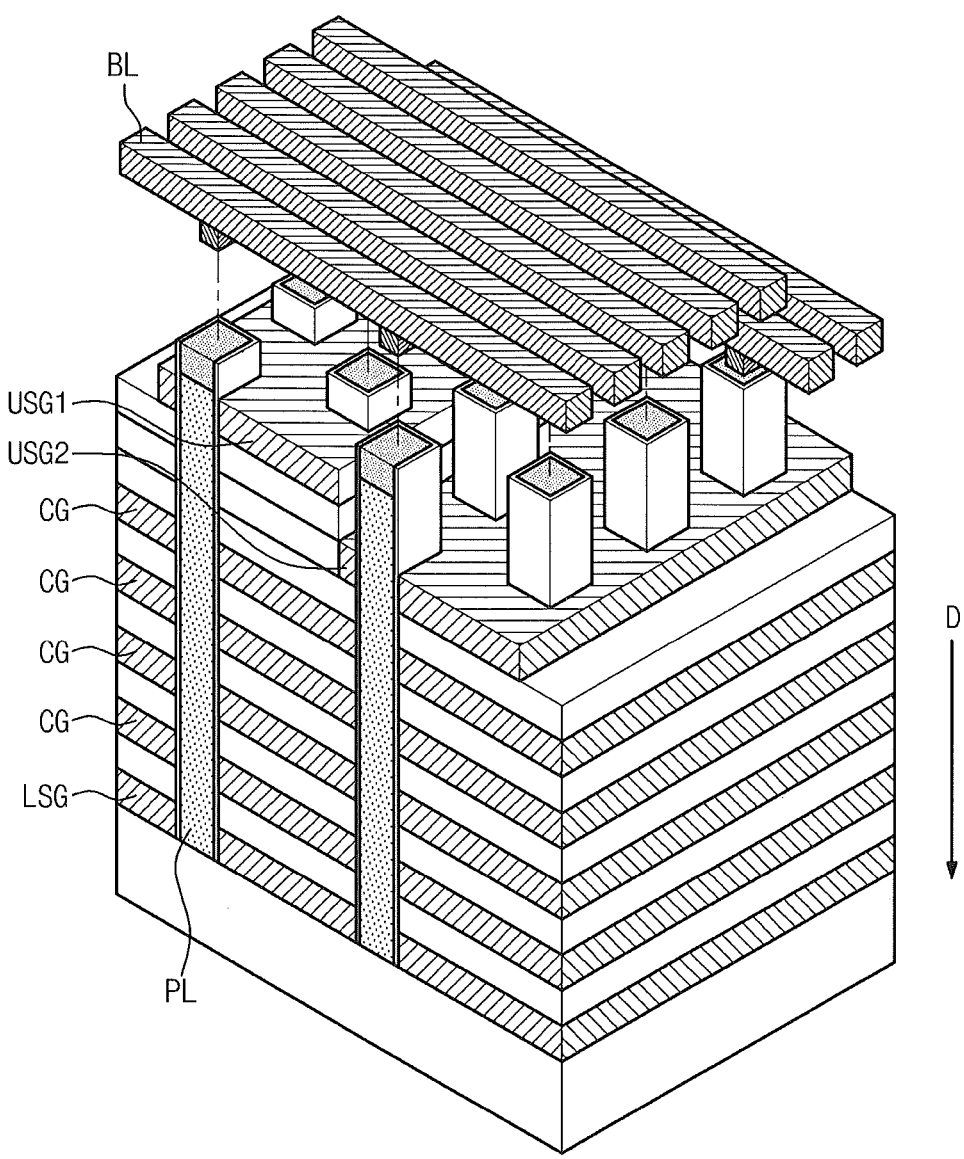
Figure 6C:
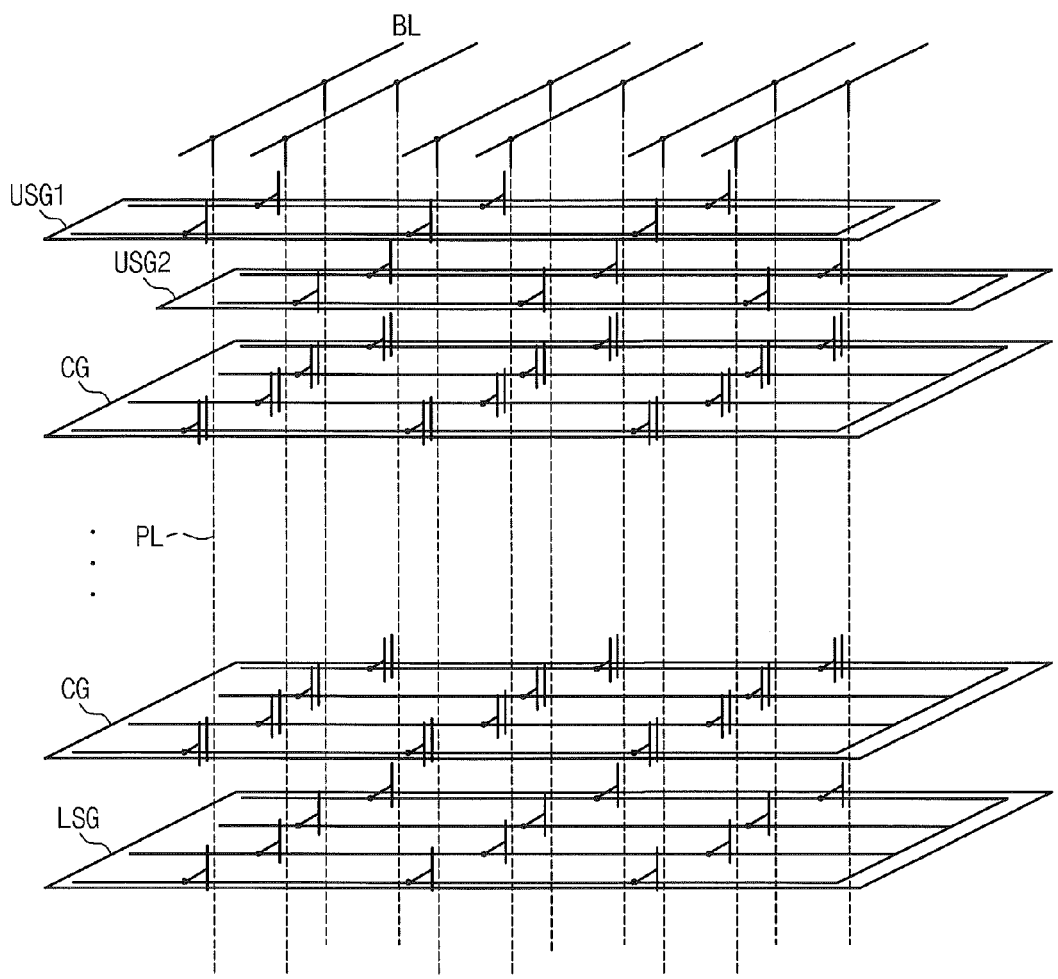
Figure 6D:
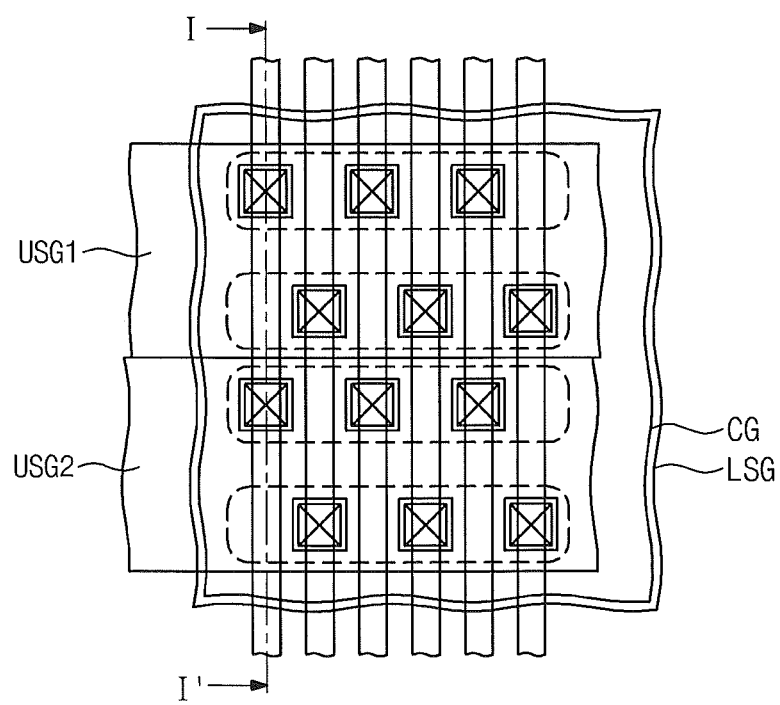
Figure 6E:
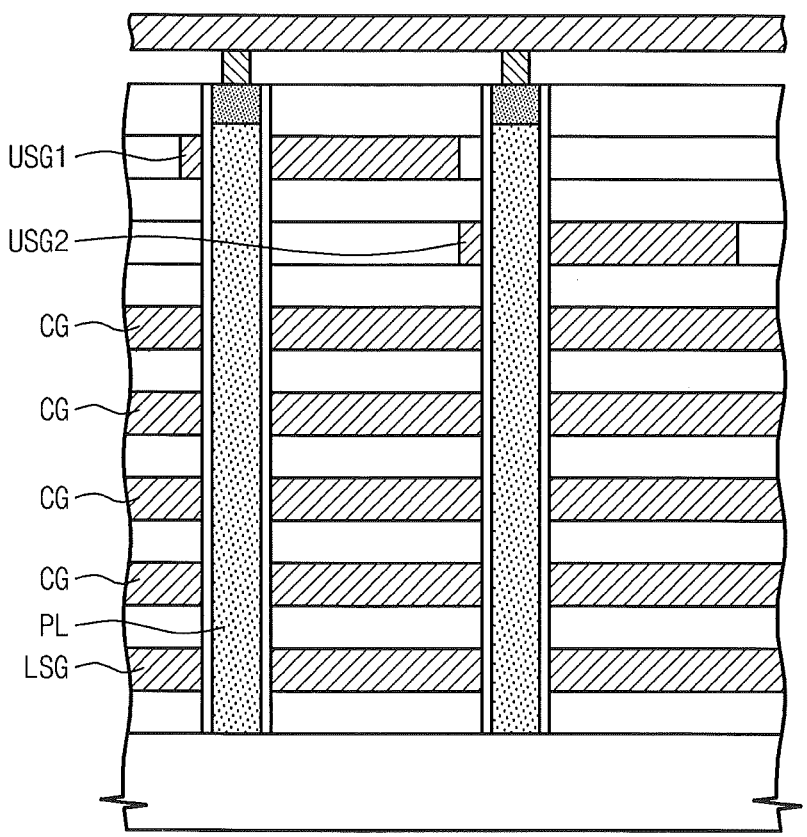

FIGS. 6A-6E are a schematic plan view, a perspective view, a schematic perspective view, a plan view and a cross-sectional view, respectively, illustrating immediately adjacent alternatingly offset vertical NAND channels coupled to upper select gate lines that are offset from one another in some embodiments of the inventive concept. In particular, FIGS. 6A-6E show an upper select gate line USG1, USG3 . . . immediately adjacent, to a second upper select gate line USG2, USG4 . . . . The bit lines BL extend across the upper select gate lines USG1 and USG2 in the direction D to electrically contact the channels PL. It will be understood that the upper select gate lines USG1 and USG2 are offset from one another in a direction of the vertical channels PL. For example, as shown in FIG. 6B, the upper select gate line USG1 is shown above the upper select gate line USG2. Accordingly, in some embodiments of the inventive concept, in addition to the plurality of immediately adjacent vertical NAND channels being alternatingly offset, the upper select gate lines used to activate those channels can also be offset from one another in the direction of the channels in some embodiments of the inventive concept.

Figure 7A:
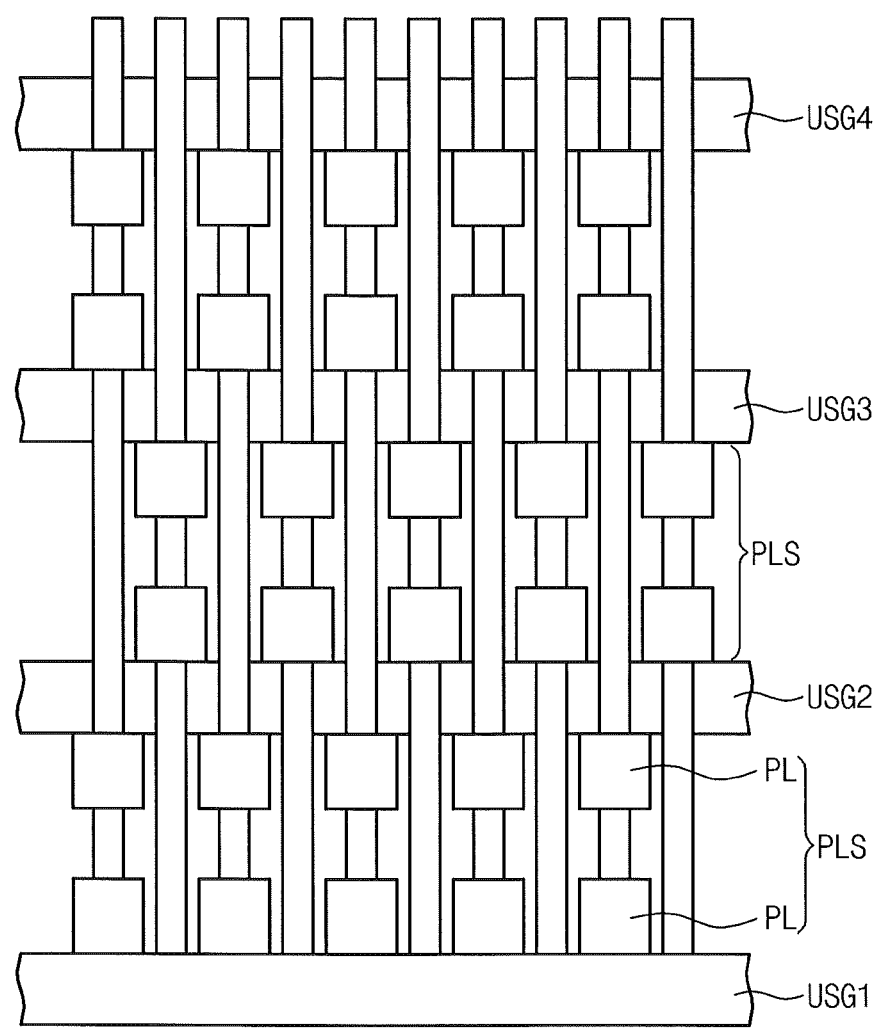
FIGS. 7A-7C are a schematic plan view, a perspective view, and a plan view, respectively, illustrating alternatingly offset vertical NAND channels which have been split (i.e., split channel) in some embodiments of the inventive concept.
Figure 7B:
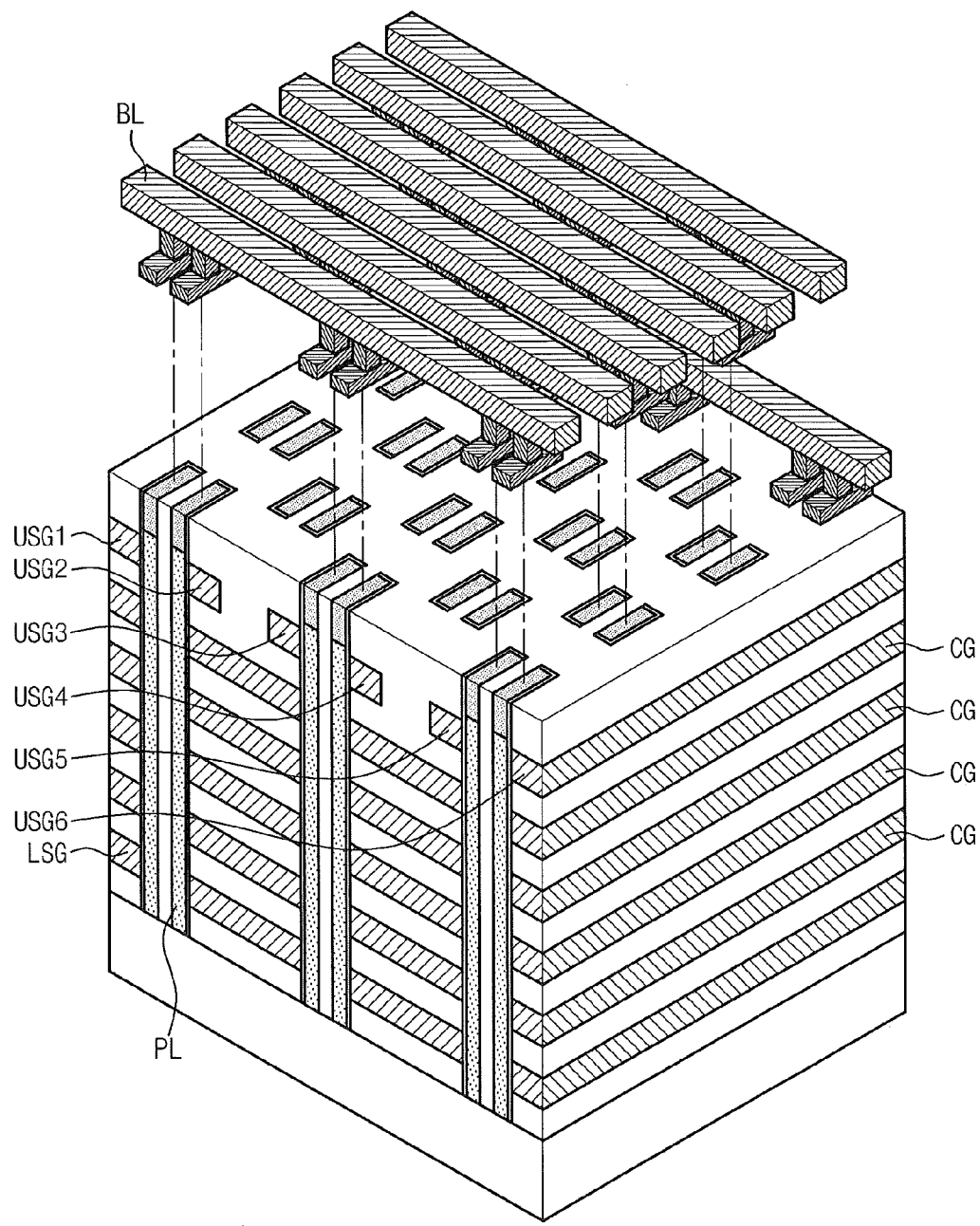
Figure 7C:
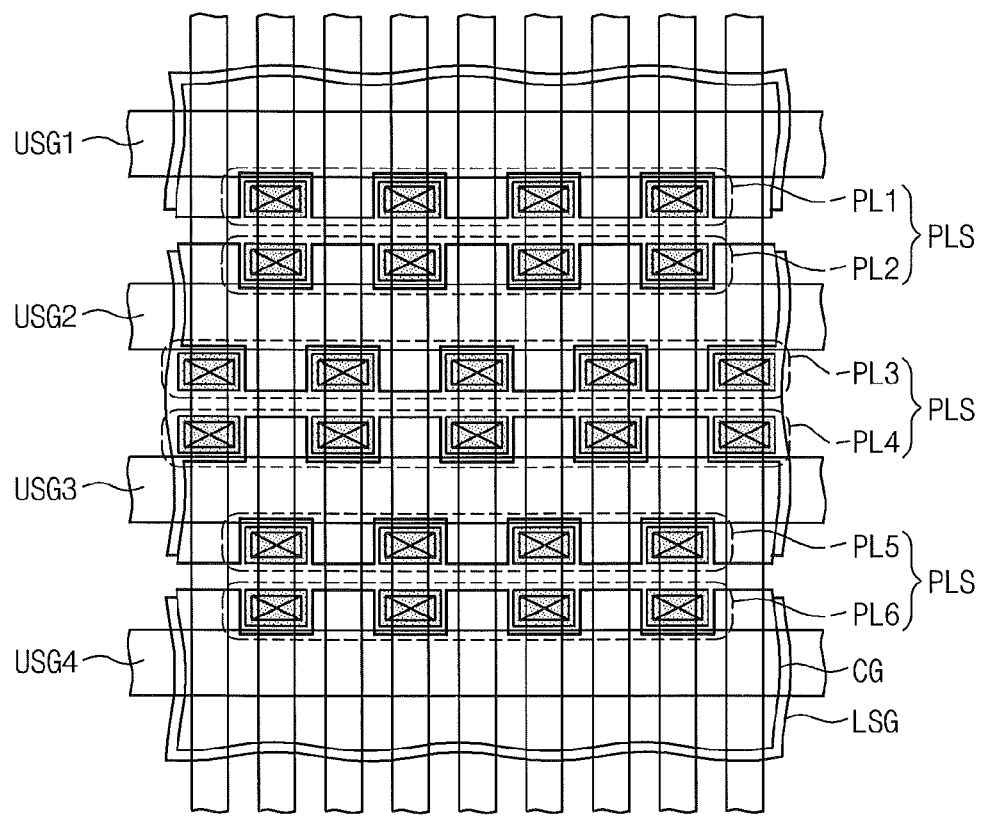

FIGS. 7A-7C are a schematic plan view, a perspective view, and a plan view, respectively, illustrating immediately adjacent alternatingly offset vertical NAND channels having been split in some embodiments of the inventive concept. In particular, as shown in FIG. 7A, the split channels can be provided by separating what would otherwise be formed as a single channel PLS into two separate channels which are insulated from one another. As in FIG. 1-6 that vertical channel where the channel will be formed is of a pillar or tubular shape, USG or LSG surrounds the vertical channel. In contrast, for FIG. 7A-7C where vertical channel is of split type and separated split channels face each other, split channels should be connected to other USG or LSG because they are connected to the same bit line and word line. Thus, in operation, the upper select gate lines which contact the NAND channel split channels operate independently of one another. For example, as shown in FIG. 7B, the split channels PL are formed in what would otherwise be a single channel as shown, for example, above in FIG. 5A. Moreover, separate upper select gate lines USG 1-4 can electrically contact each of the split channels so that each may be operating independently. For example, USG1 is shown electrically coupled to one side of the split channel PL whereas upper select gate line USG2 is shown coupled to the opposing side of the split channel PL. Still further, the lower select gate line LSG can be provided in common with each of the separate upper select gate lines.

Figure 8A:
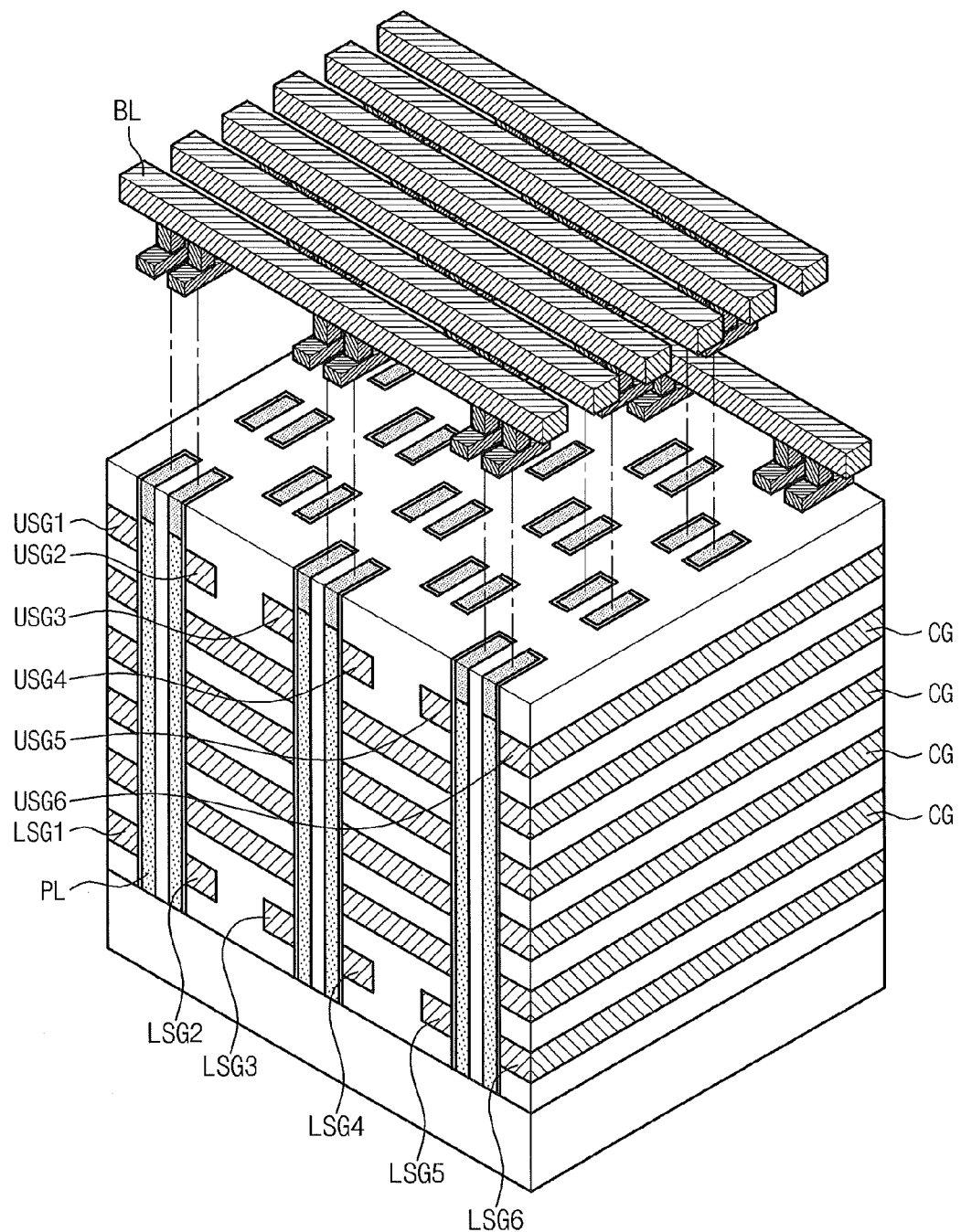
FIGS. 8A and 8B are a perspective view and a plan view, respectively, illustrating alternatingly offset vertical NAND channels being split (i.e., split channel) wherein the upper select gate lines are separated from one another and are paired with similarly separated lower select gate lines in some embodiments of the inventive concept.
Figure 8B:
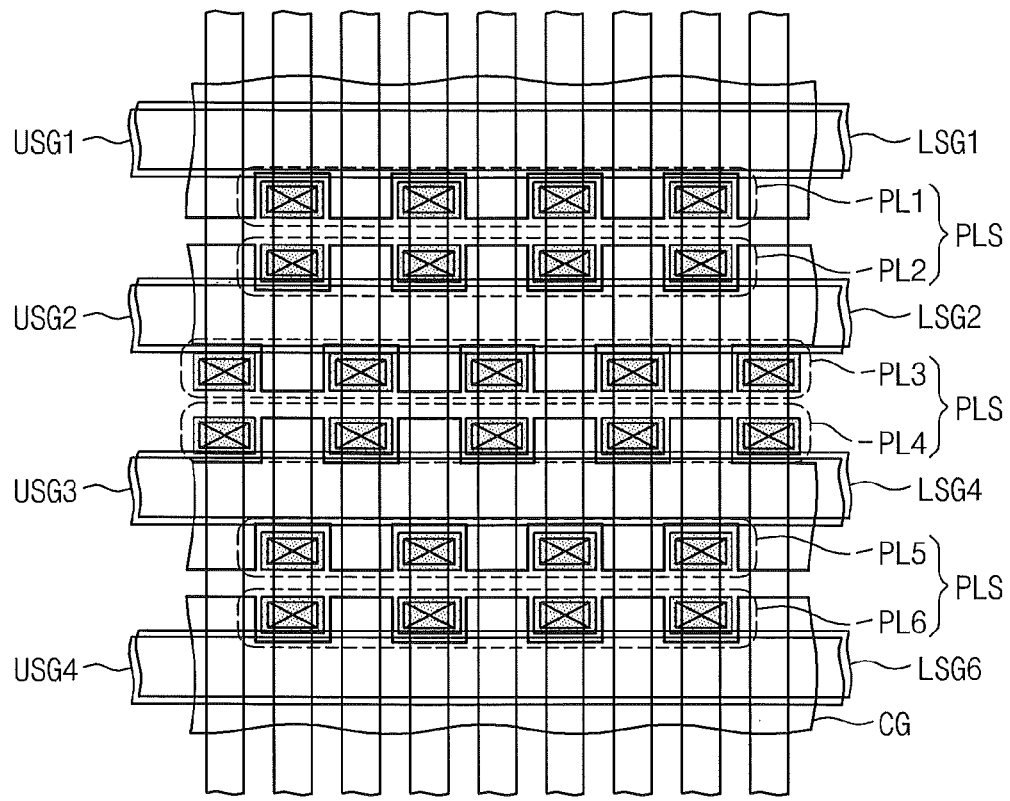

FIGS. 8A-8B are a perspective view and a plan view illustrating immediately adjacent alternatingly offset vertical NAND channel split channels with separate lower select gate lines paired with the separate upper gate select lines in some embodiments of the inventive concept. For example, as shown in FIG. 8A, upper select gate line USG1 is coupled to one side of the split channel PL whereas the second upper select gate line USG2 is coupled to the opposite side of the split channel. Moreover, the lower select gate line 1 is paired with the upper select gate line USG1 and the lower select gate line LSG2 is paired with the upper select gate line USG2. Accordingly, separate lower select gate lines can be paired with separate upper select gate lines in some embodiments of the inventive concept. This embodiment may be applied to the device disclosed in "Bit Cost Scalable Technology With Punch and Plug Process For Ultra High Density Flash Memory," by H. Tanaka et al. in Symp. On VLSI Tech. Dig., pp 14~15(2007).

Figure 9A:
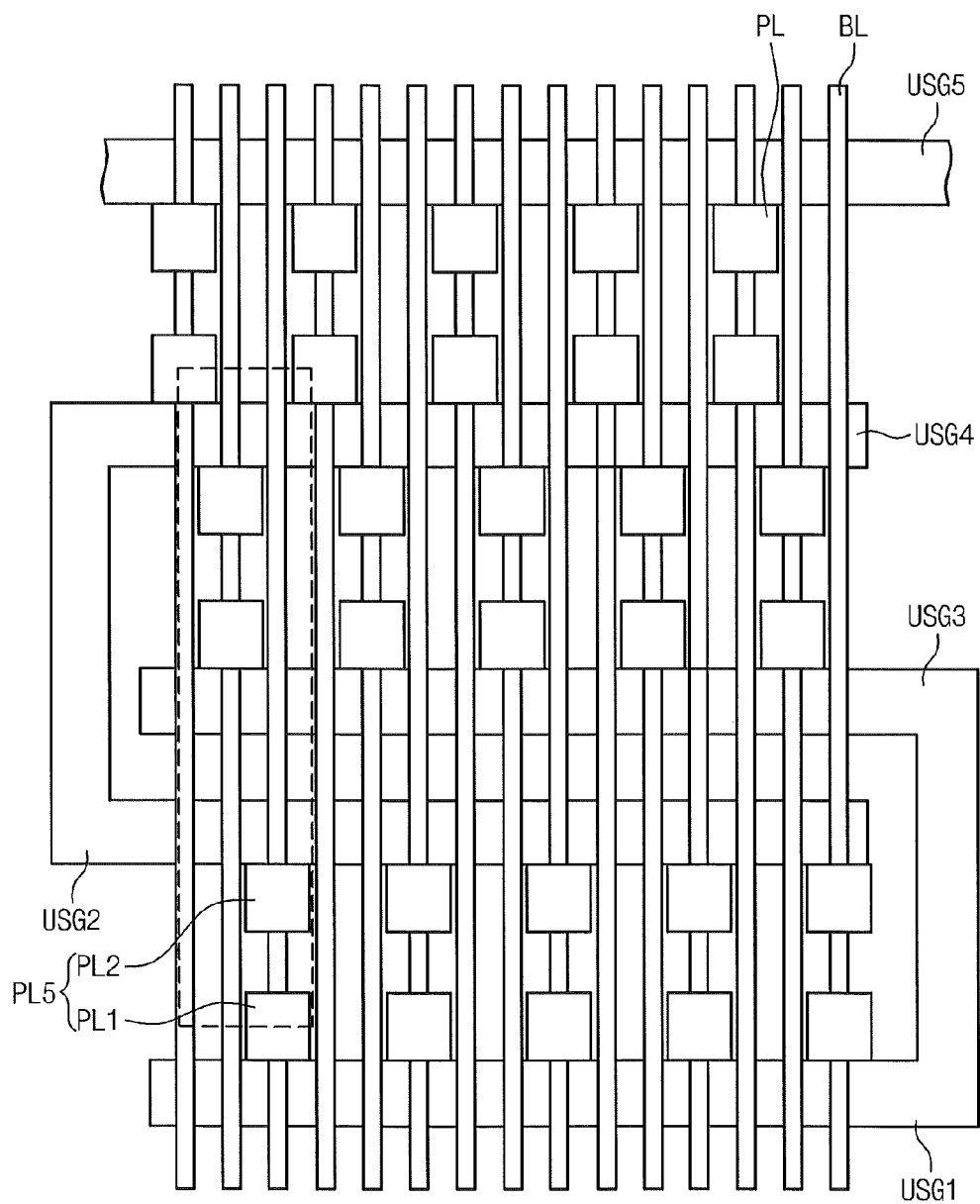
FIGS. 9A-9C are a schematic plan view, a perspective view, and a plan view, respectively, illustrating offset vertical NAND channels having been split (i.e., split channel) coupled to interdigitated upper select gate lines in some embodiments of the inventive concept.
Figure 9B:
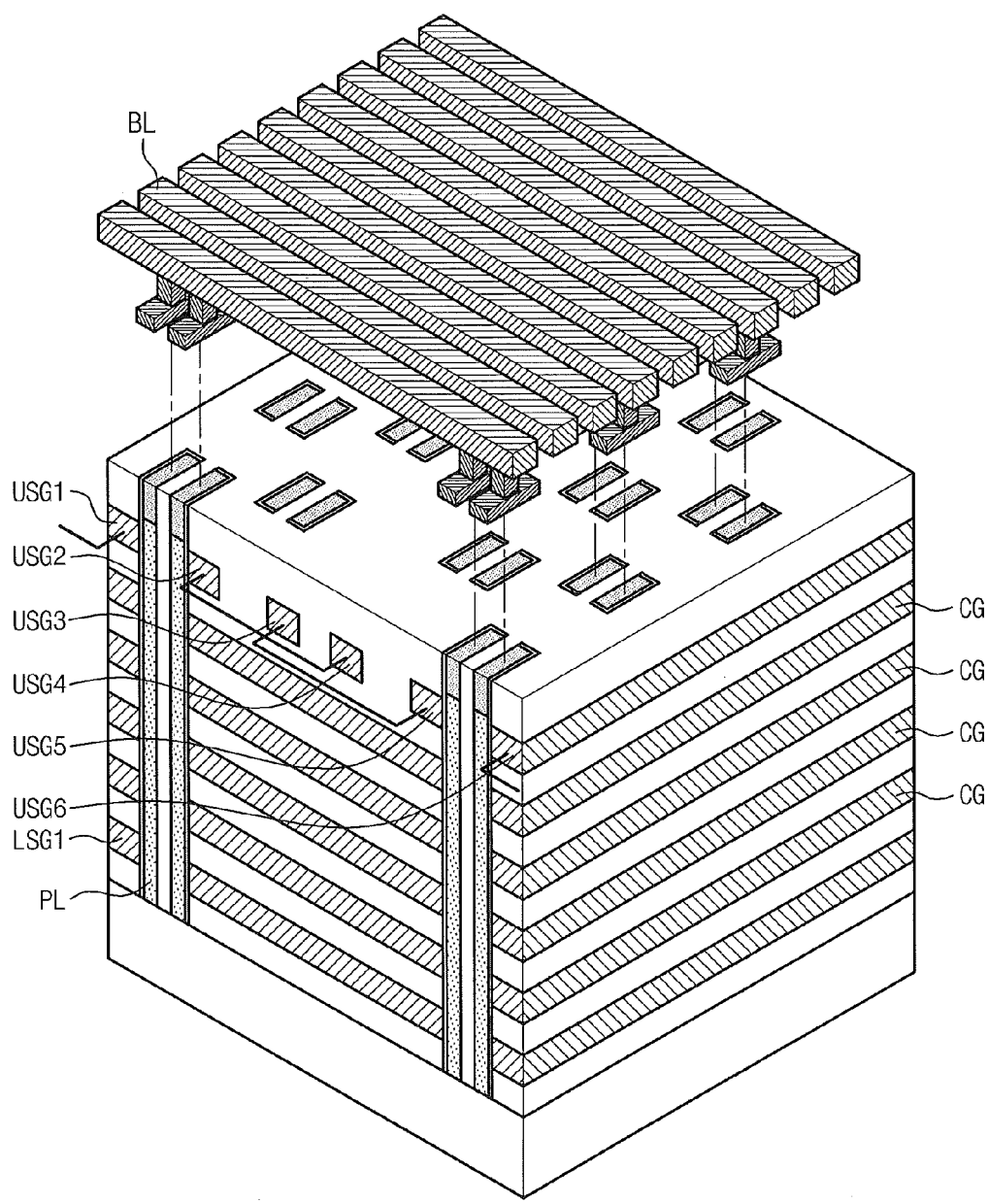
Figure 9C:
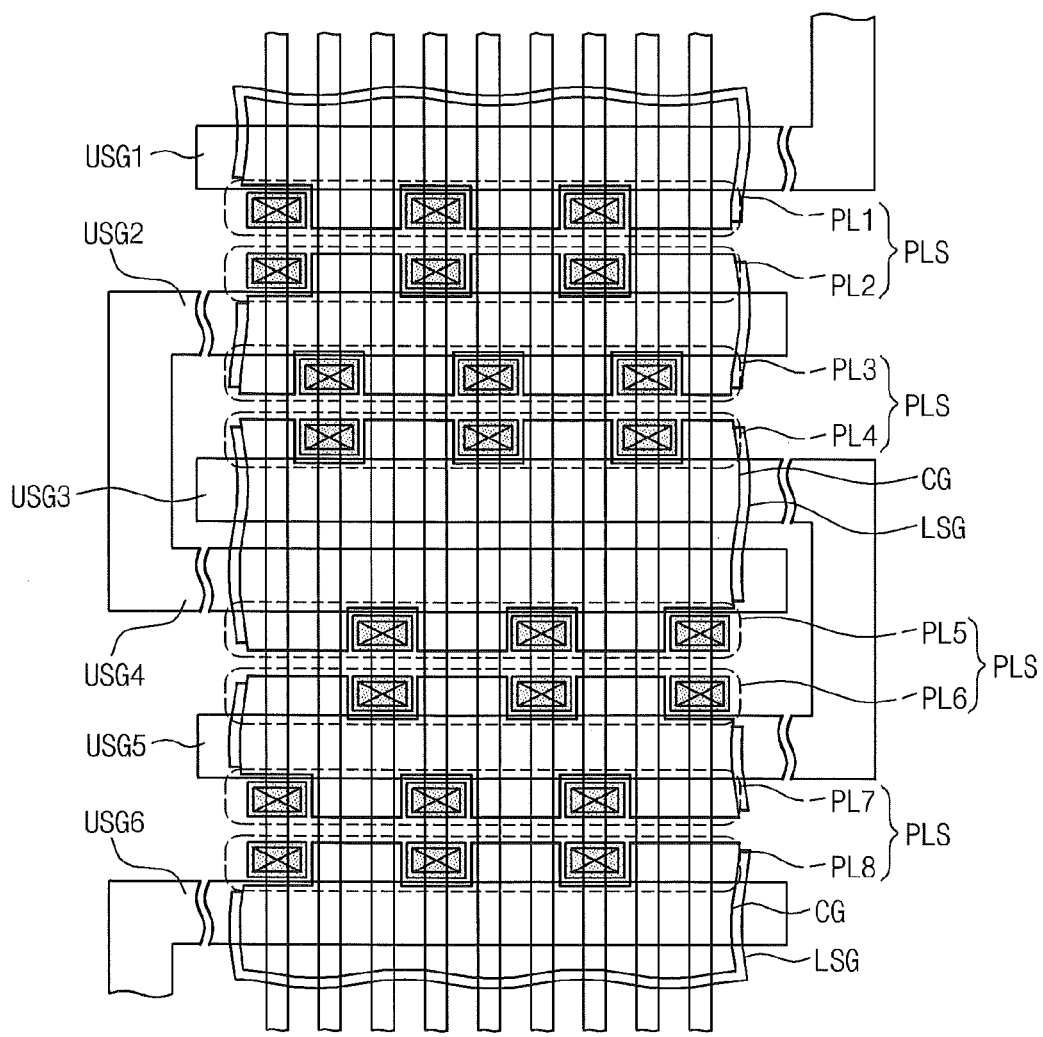

FIGS. 9A-9C are a schematic plan view, a perspective view, and a plan view, respectively, illustrating immediately adjacent offset vertical NAND channel split channels having interdigitated upper select gate lines in some embodiments of the inventive concept. For example, as shown in FIG. 9A, opposing sides PL1 and PL2 of the split channel which would otherwise be part of a single channel PLS are coupled to different upper select gate lines USG1 and USG2. Moreover, the upper select gate lines USG1 and USG3 (electrically coupled to one another) are interdigitated with the upper select gate line USG2 so that at least a portion of the upper select gate line USG2 extends inside an opening that is defined by the layout of the upper select gate lines USG1 and USG3. Similarly, the upper select gate line USG3 is interdigitated with the upper select gate lines USG2 and USG4 so that at least a portion of the upper select gate line USG3 extends inside an opening that is defined by the layout of the upper select gate lines USG2 and USG4. Accordingly, immediately adjacent split channels PL formed from different channels PLS are electrically coupled to different upper select gate lines. Furthermore, the separate upper select gate lines can be paired with a common lower select gate line LSG1 as shown, for example, in FIG. 9B.

Figure 10A:
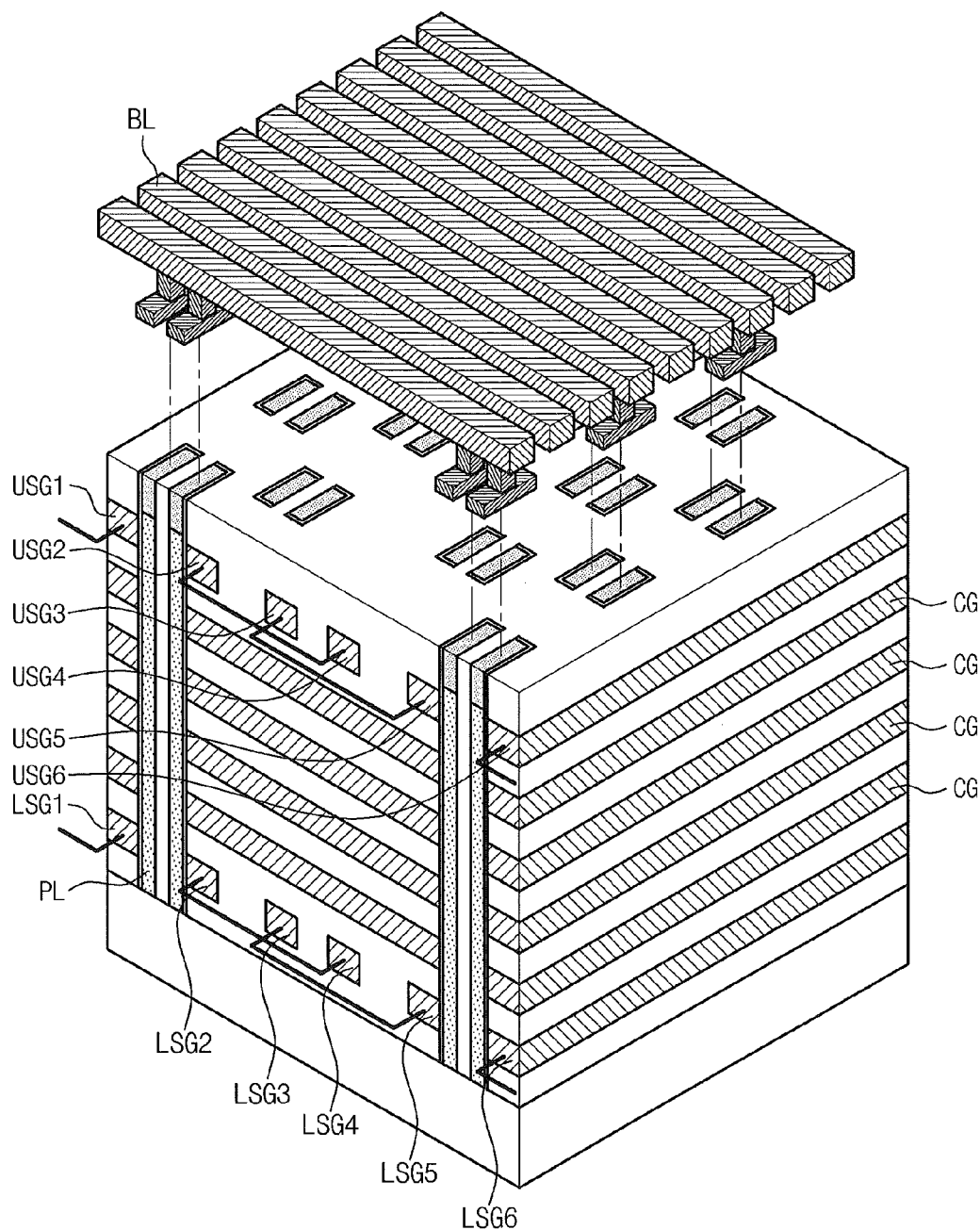
FIGS. 10A-10B are a perspective view and a plan view, respectively, illustrating offset vertical NAND channels having been split (i.e., split channel) coupled to separate upper select and lower select gate lines that are paired with one another and interdigitated in some embodiments of the inventive concept.
Figure 10B:
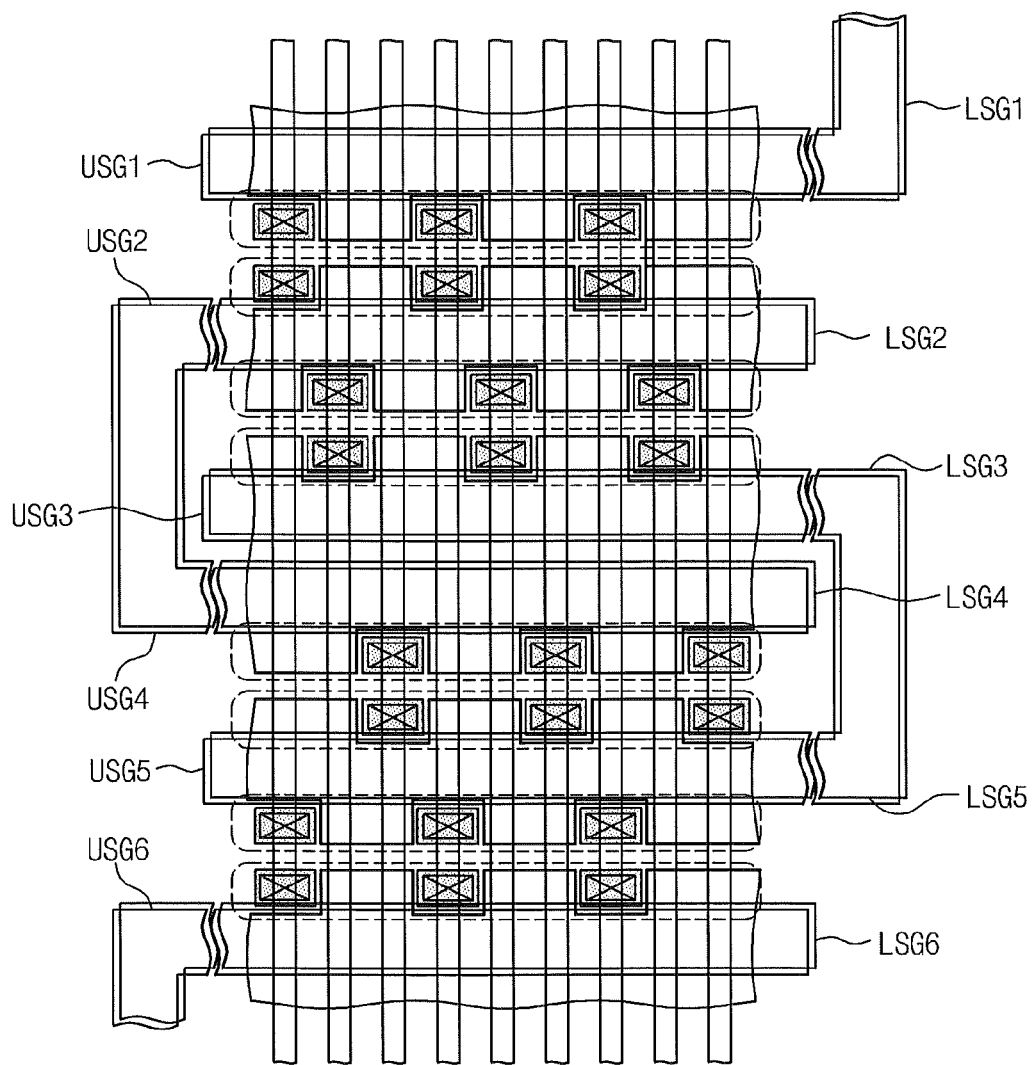

FIGS. 10A-10B are a perspective view and a plan view, respectively, illustrating a plurality of immediately adjacent offset vertical NAND channel split channels coupled to interdigitated upper selected gate lines which are paired with similarly separated interdigitated lower select gate lines LSG in some embodiments of the inventive concept.

Figure 11A:
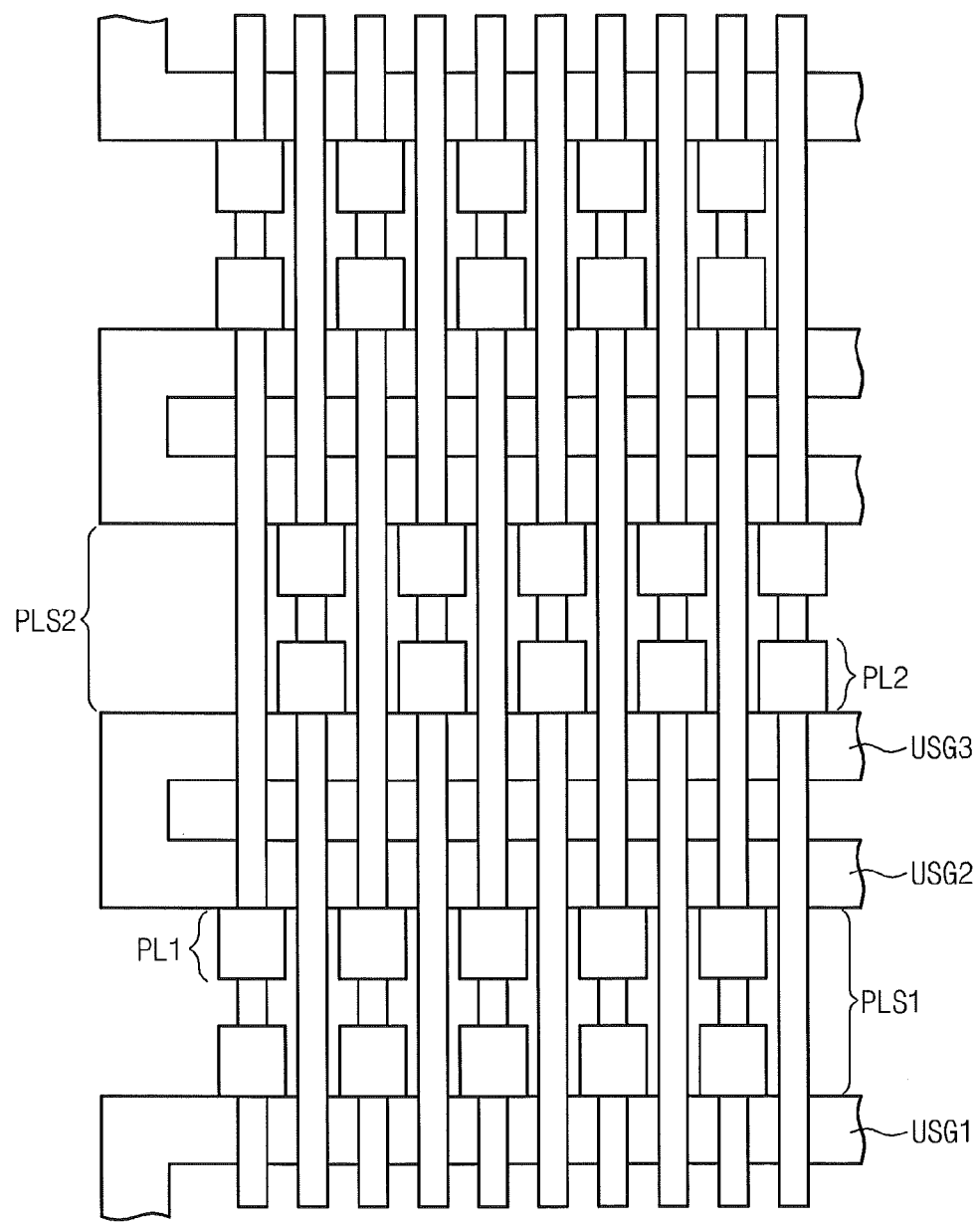
FIGS. 11A-11B are a schematic plan view, a perspective view, and a plan view, respectively, illustrating alternatingly offset vertical NAND channels having been split (i.e., split channel) coupled to separate upper and lower select gate lines paired with one another in some embodiments of the inventive concept.
Figure 11B:
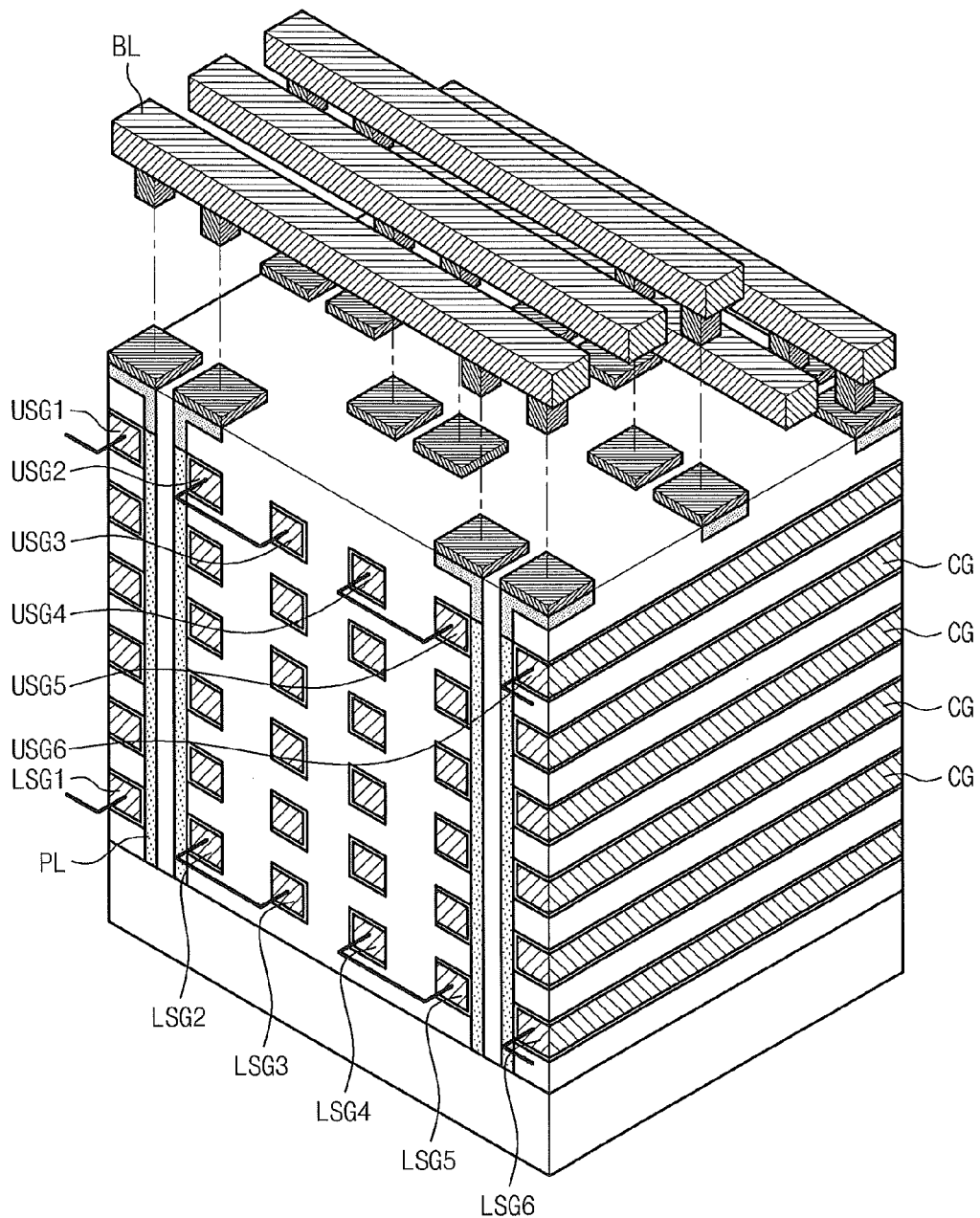

FIGS. 11A-11B are a schematic plan view and a perspective view, respectively, illustrating a plurality of immediately adjacent alternatingly offset vertical NAND channel split channels coupled to non-interdigitated upper select gate lines in some embodiments of the inventive concept. In particular, as shown in FIG. 11A, split channels formed from different pillars and immediately adjacent to one another are electrically coupled to upper select gate lines which are coupled together. In particular, FIG. 11A shows that, for example, upper select gate USG2 is electrically connected to a first plurality of split channels PL1 whereas upper select gate line 3 is electrically connected to a separate plurality of split channels PL2 which are adjacent to the first plurality of split channels. Moreover, the first and second pluralities of split channels PL1 and PL2 are associated with different pillars PLS 1 and PLS 2 used to form the split channels. Further, the upper select gate line USG2 is electrically connected to the upper select gate line USG3. Overall, the upper select gate lines, which are connected together to contact immediately adjacent ones of the split channels, are not interdigitated with one another in contrast to the arrangement shown, for example, in FIGS. 10A-10B in some embodiments of the inventive concept. The manner of electrically connecting USG2 and USG3 is not limited and varied according to the inventive concept of the present invention. For example, USG 2 and USG3 may be patterned to form a line. Alternatively, they can be connected by means of other extension such as 'via.' This embodiment may be applied to the device disclosed in US Patent Publication No. 2009-0121271 entitled 'Vertical-type non-volatile memory devices. wherein a further trench for separating metal gate is required.

Figure 12:
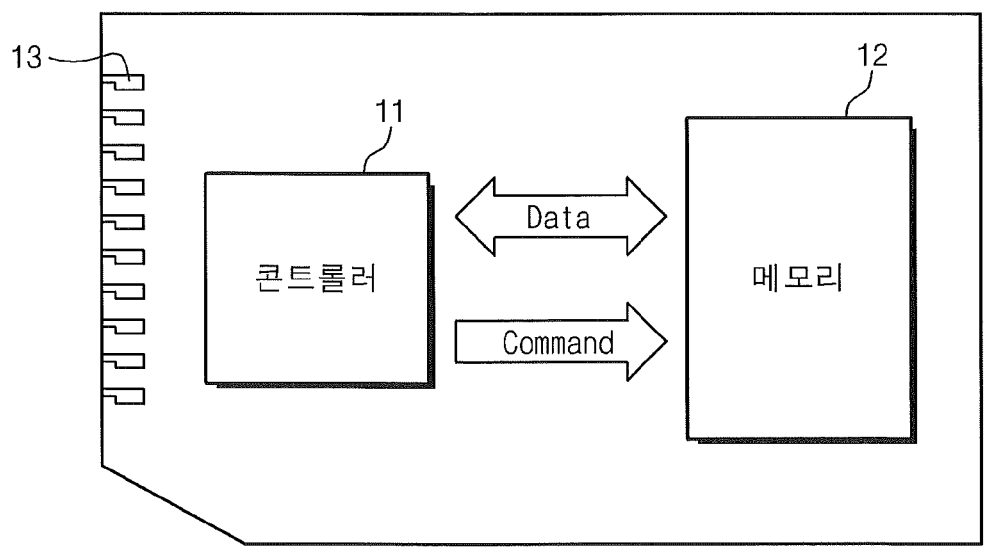
FIG. 12 is a schematic representation of a standard form-factor memory card including nonvolatile memory devices having offset vertical NAND channels in some embodiments of the inventive concept.

FIG. 12 is a schematic representation of a standard form-factor memory card 10 that can include nonvolatile memory devices including immediately adjacent offset vertical NAND channels (either split or nonsplit) in some embodiments of the inventive concept. In operation, the standard form-factor memory card 10 can provide data pins 13 along an edge thereof so that data may be provided to/from the card. Still further, a processor circuit 11 can coordinate operation of the memory card 10 so data provided to the memory card 10 is stored within a nonvolatile memory 12 by issuing data and commands thereto. Still further, the processor circuit 11 can issue commands to the nonvolatile memory 12 to retrieve requested data which is then, in turn, provided from the memory card 10 via the data pins 13 in some embodiments of the inventive concept.

It will be understood that a memory card can be a Multi-Media Card (MMC)/Secure Digital (SD) form-factor compliant memory card. As used herein, the term "form-factor" means the physical size and shape of the memory card. Moreover, the form-factor of memory cards according to some embodiments of the invention is described herein as a Multi-Media Card (MMC)/Secure Digital memory card that has a size and shape that allows such memory cards to be used with other compliant devices, such as readers. As known to those skilled in the art, SD represents a later developed version of the MMC standard which may allow MMC compliant memory cards to be used with SD compliant devices. In some embodiments of the inventive concept, MMC/SD form-factor compliant devices measure about 32 mm×about 24 mm×about 1.4 mm and can be shaped substantially as shown in FIG. 12. The MMC and SD standards are discussed further on the world-wide-web at "mmca.org."

Figure 13:
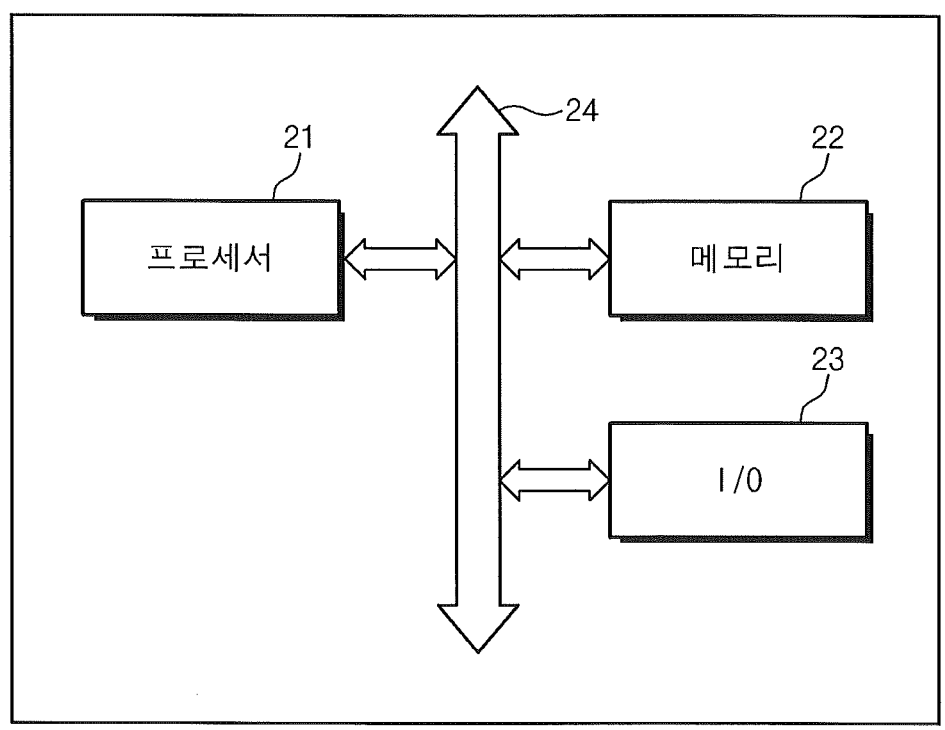
FIG. 13 is a schematic representation of a system including a nonvolatile memory system having offset vertical NAND channels in some embodiments of the inventive concept.

FIG. 13 is a schematic illustration of a system 20 including a nonvolatile memory 22 including immediately adjacent offset vertical NAND channels (either split or nonsplit) in some embodiments of the inventive concept. In particular, a processor circuit 21 can interact with various subcomponents of the system 20 via a bus 24 to, for example, provide data from the system 20 via an I/O subsystem 23 which receive data from outside the system 20. Still further, the processor circuit 21 can provide data to/from the nonvolatile memory 22 via the bus 24 to, for example, store data therein or to retrieve data therefrom. The data may either be provided via the I/O subsystem 23 from outside or may be fetched from the nonvolatile memory 22 and provided external to the system 20 via the I/O subsystem 23 under processor circuit 21 control. It will be understood that the nonvolatile memory 22 can include nonvolatile memory devices including immediately adjacent offset vertical NAND channels (either split or nonsplit) in some embodiments of the inventive concept.

The vertical NAND devices having a plurality of immediate adjacent offset vertical channels according to the present invention increases page size thereby increasing read/write performance of the devices. Referring to FIG. 2C wherein CG and LSG are common for channels, exemplified voltage values that can be applied to a bit line, upper selection gate (USG) and so on are indicated in the table below. In the table, Vcc means a 'turn on voltage' for USG, Vpass means a 'pass voltage' for lessening Program disturbance, Vpgm a 'programming voltage', Verase an erase voltage, Vread pass, a 'read pass voltage' applied to unselected control gate, Vread a 'read,' applied to selected control gate, respectively. 'Floating' means that the corresponding element is floated to a certain voltage without applying any voltage. The operation of the vertical NAND devices is more described in US Patent Publication No. 2009-0310425 entitled. "Memory Devices Including Vertical Pillars And Methods Of Manufacturing And Operating The Same," the disclosure of which is hereby incorporated herein by reference.

Figure 23:
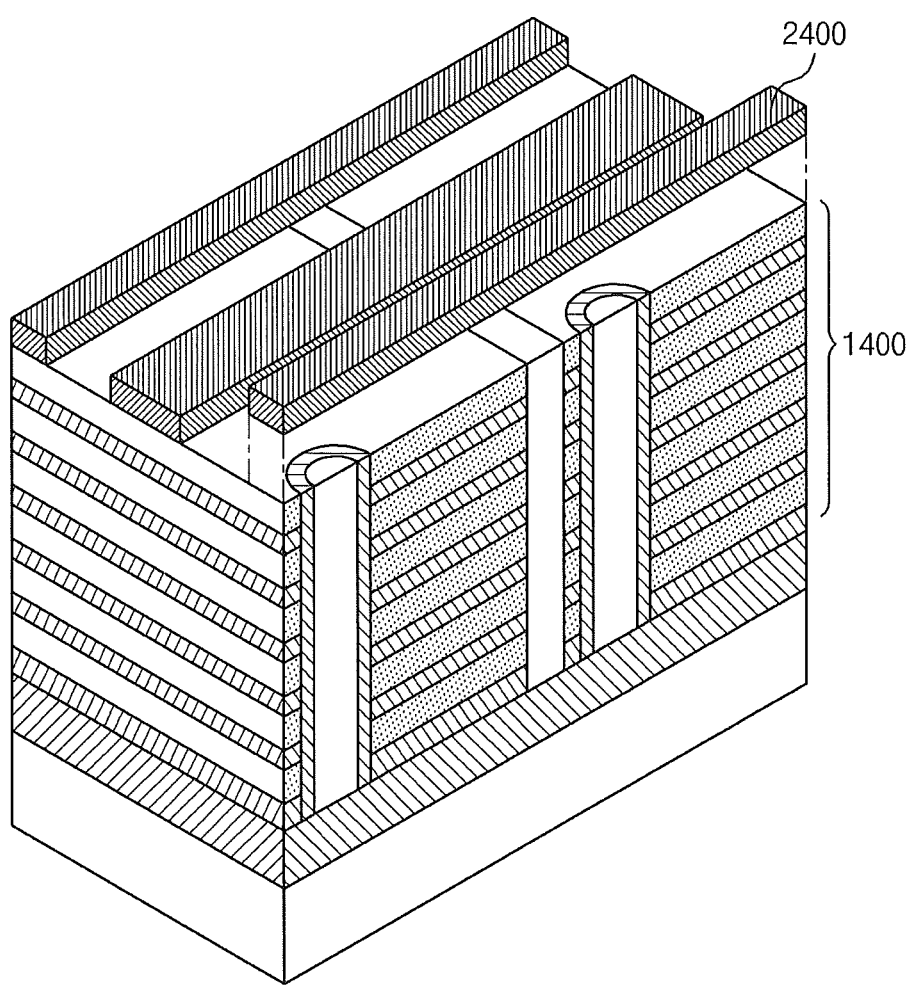
Figure 29:
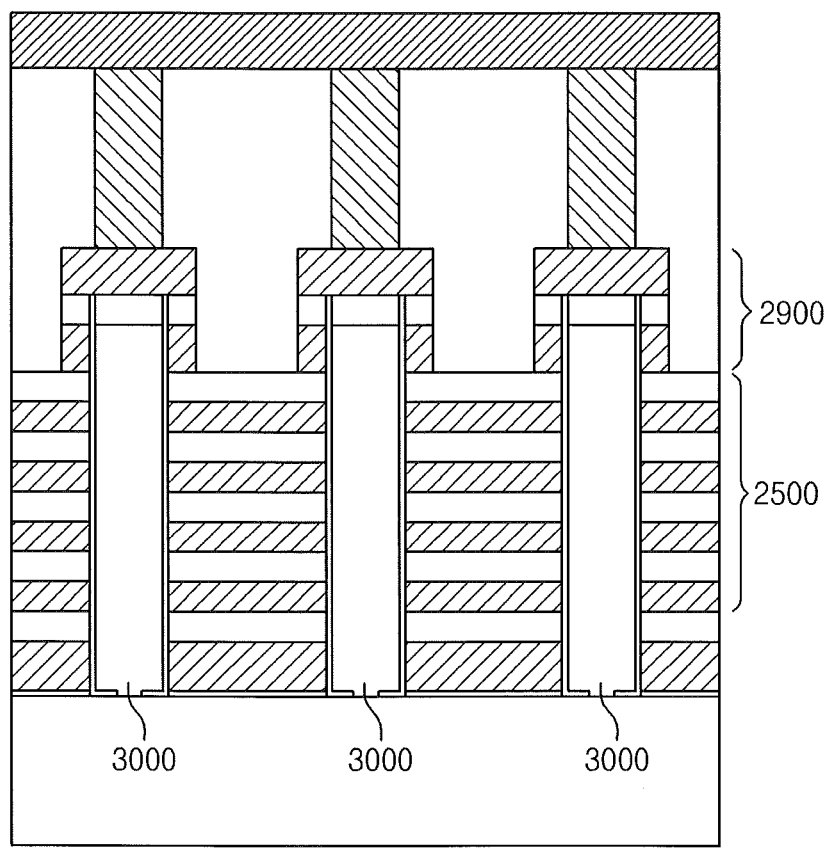

|  | Program | Erase Device in FIG. 29 (GIDL type) | Erase Device in FIG. 23 Body-tied type | Read |
|---|---|---|---|---|
| Selected BL | 0 | Vcc | floating | 0.5~1 V |
| Unselected BL | Vcc | Vcc | Floating | 0 V |
| Selected USG | Vcc | Verase | Floating | Vread_pass |
| Unselected USG | 0 V | Verase | Floating | 0 V |
| Unselected CG | Vpass | 0~1 V | 0~1 V | Vread_pass |
| Selected CG | Vpgm | 0~1 V | 0~1 V | Vread |
| LSG | 0 V | Verase | Floating | Vread_pass |
| CSL (not shown) | 1.5 V | Verase | Floating | 0 V |
| PPW (not shown) | 0 V | Verase | Verase | 0 V |

FIGS. 14-24 are perspective views illustrating the formation of a nonvolatile memory device including immediately adjacent alternatingly offset vertical NAND channel channels in some embodiments of the inventive concept.

Figure 14:
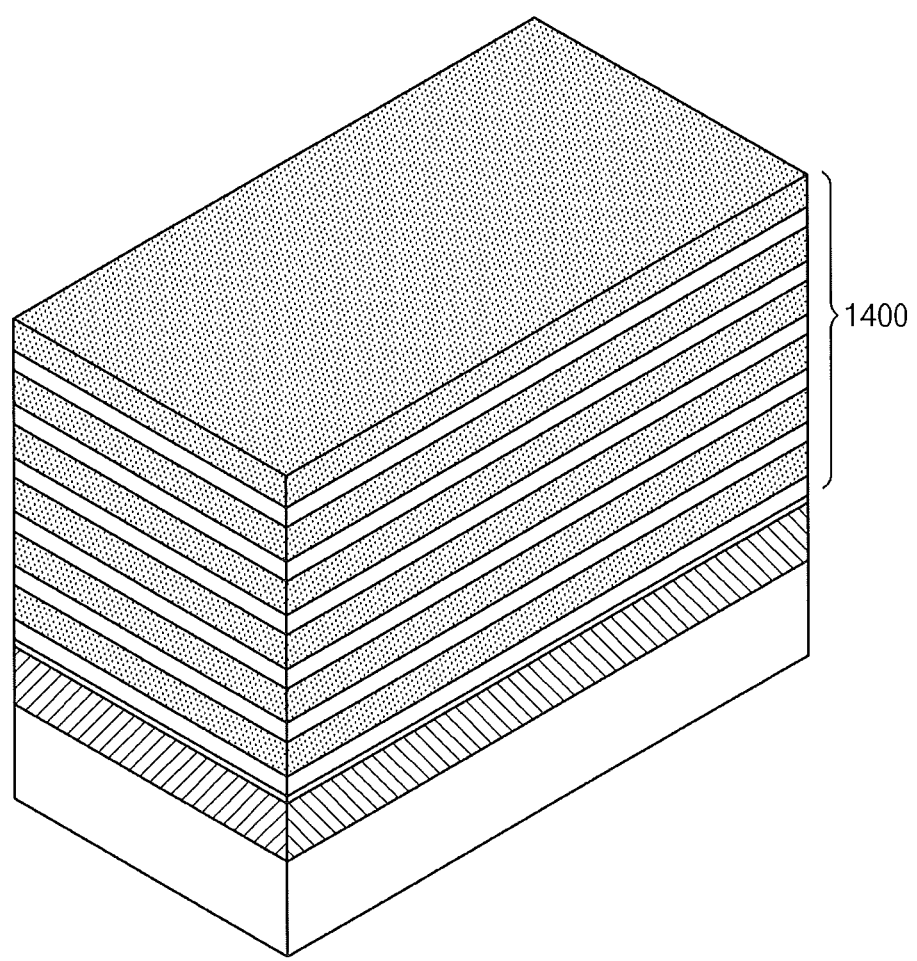
FIG. 14-23 are perspective views illustrating the formation of nonvolatile memory devices including offset vertical NAND channels in some embodiments of the inventive concept.
Figure 15:
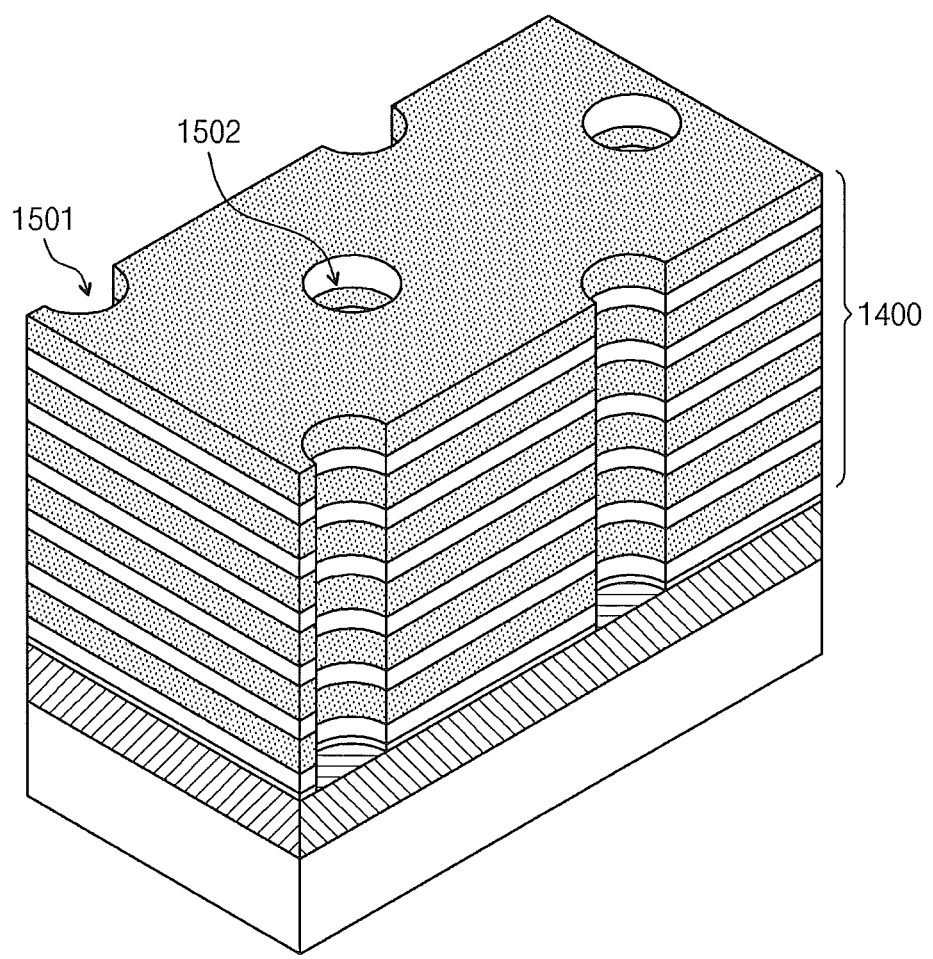
Figure 16:
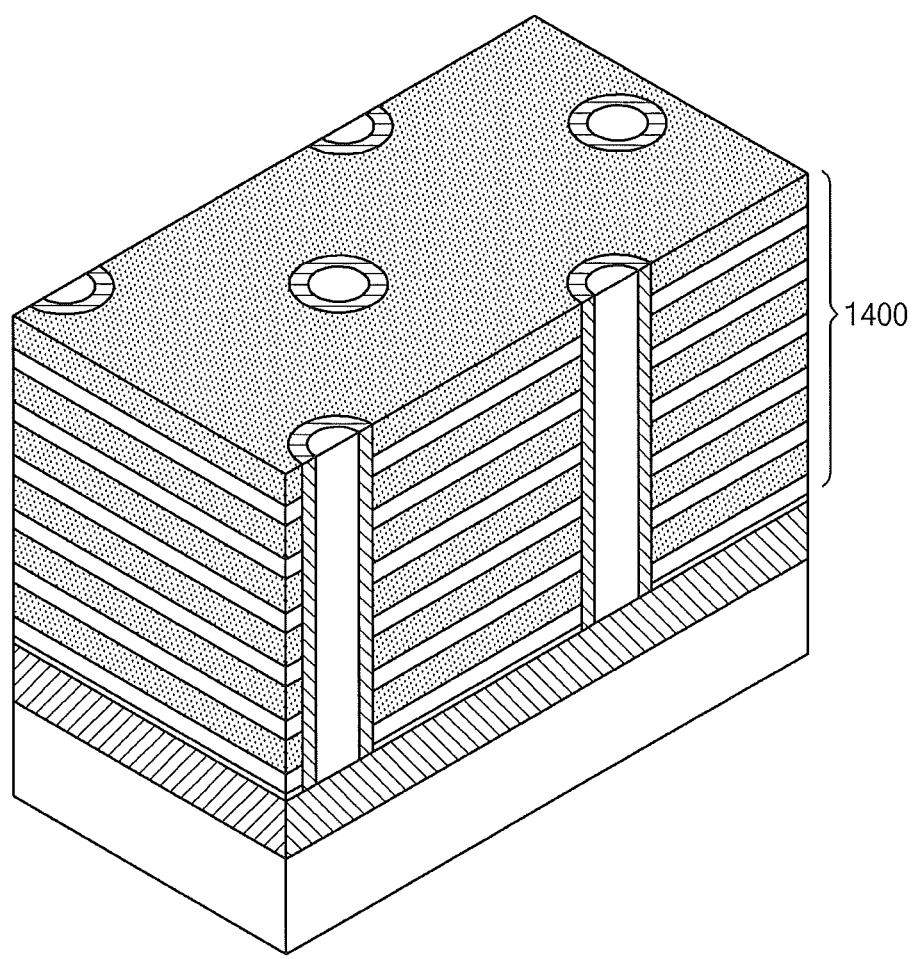

According to FIG. 14, an alternating stack of layers 1400 is formed which may be ultimately used for the formation of the different features shown to provide the nonvolatile memory devices including the plurality of the immediately adjacent alternatingly offset vertical NAND channels in some embodiments of the inventive concept. According to FIG. 15, the stack of layers 1400 is selectively patterned and remove portions thereof to form contacts 1501 and 1502 where channels will ultimately be formed for the nonvolatile memory. The shape of mask for patterning is manufactured so that the contacts are of an offset form in this embodiment. According to FIG. 16, materials are formed in the recesses to ultimately provide the split channels described herein. For example, the materials are silicon for an active region with a pillar shape or tubular shape. In case of an active region of tubular shape, the recessed portion may be filled with insulating layer such as silicon oxide.

Figure 17:
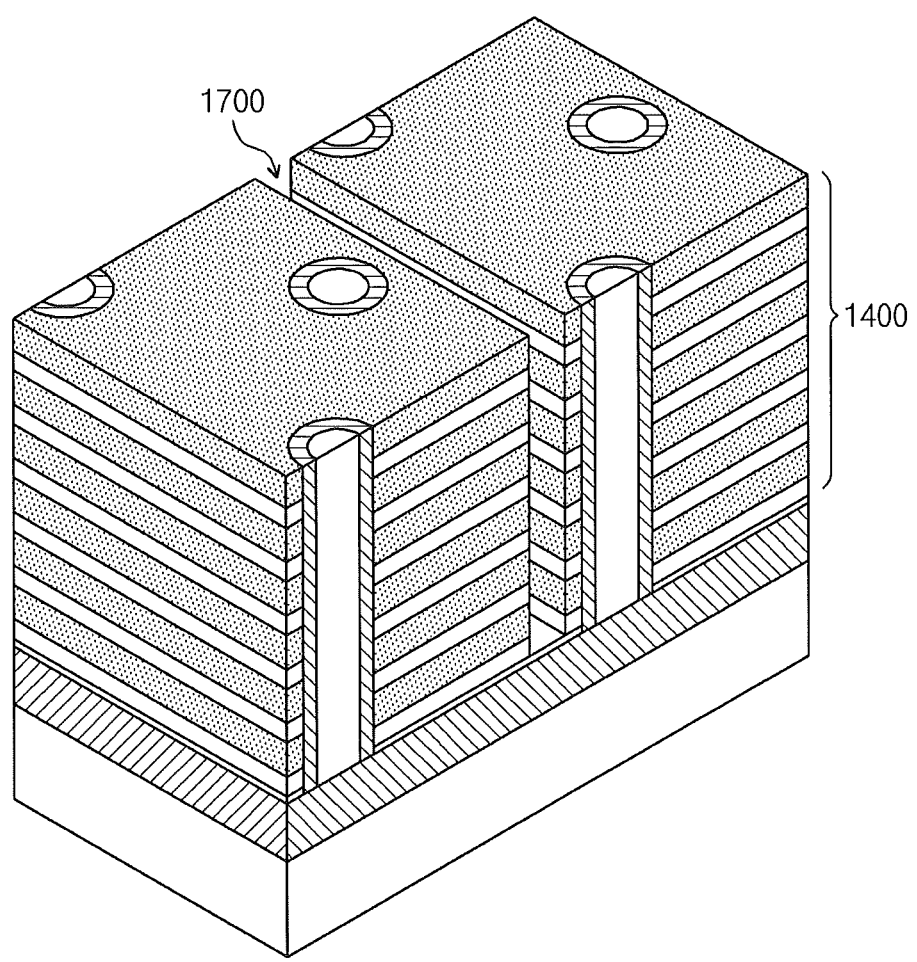
Figure 18:
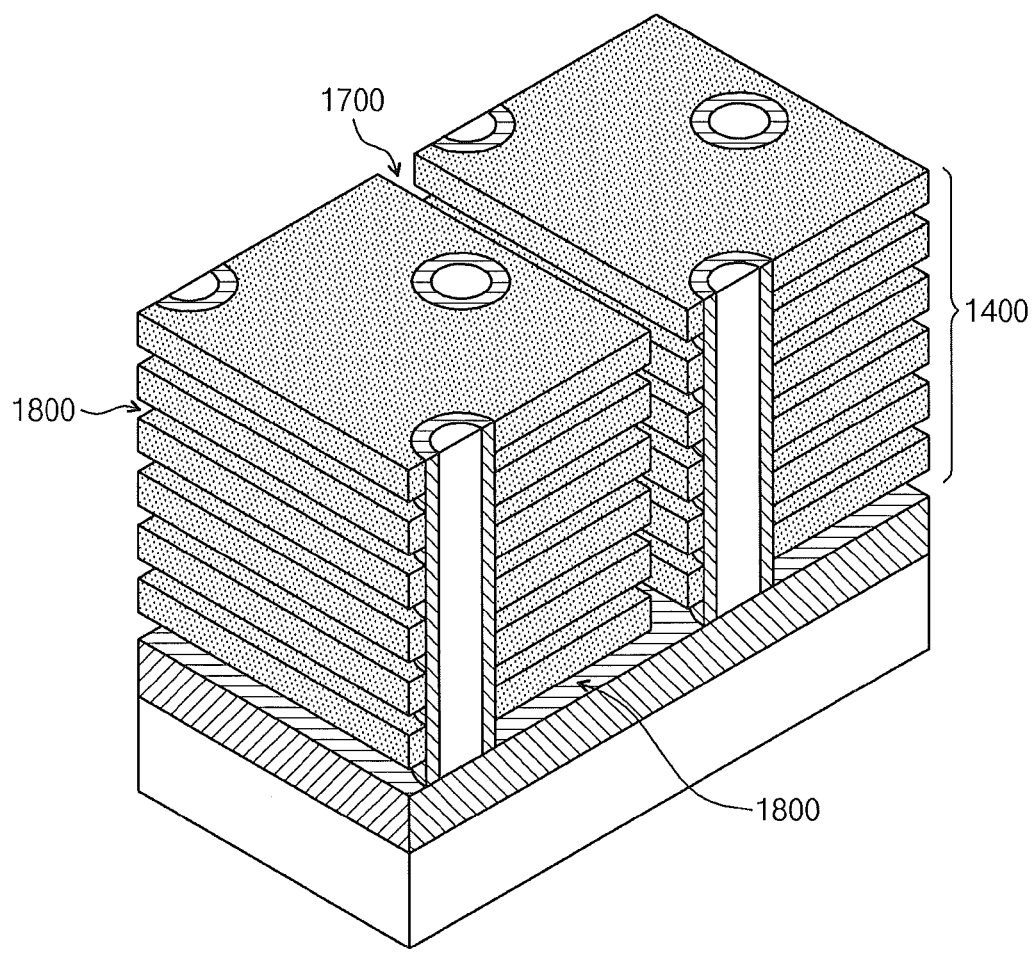
Figure 19:
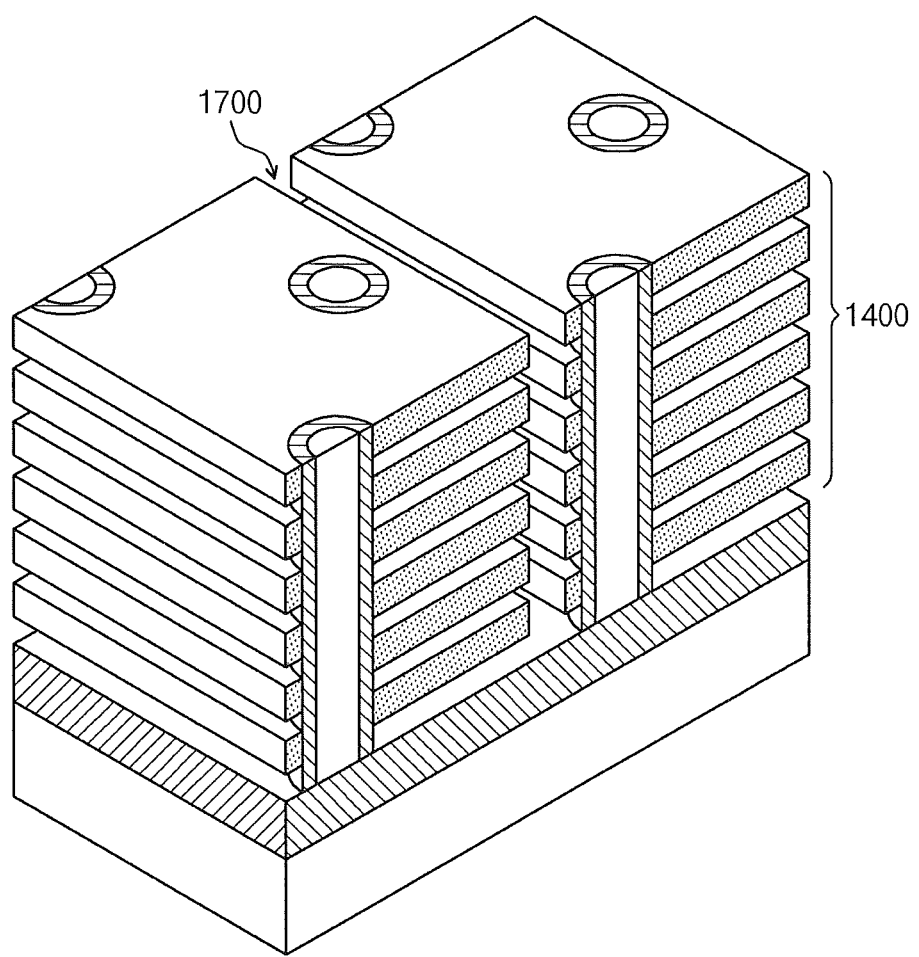
Figure 20:
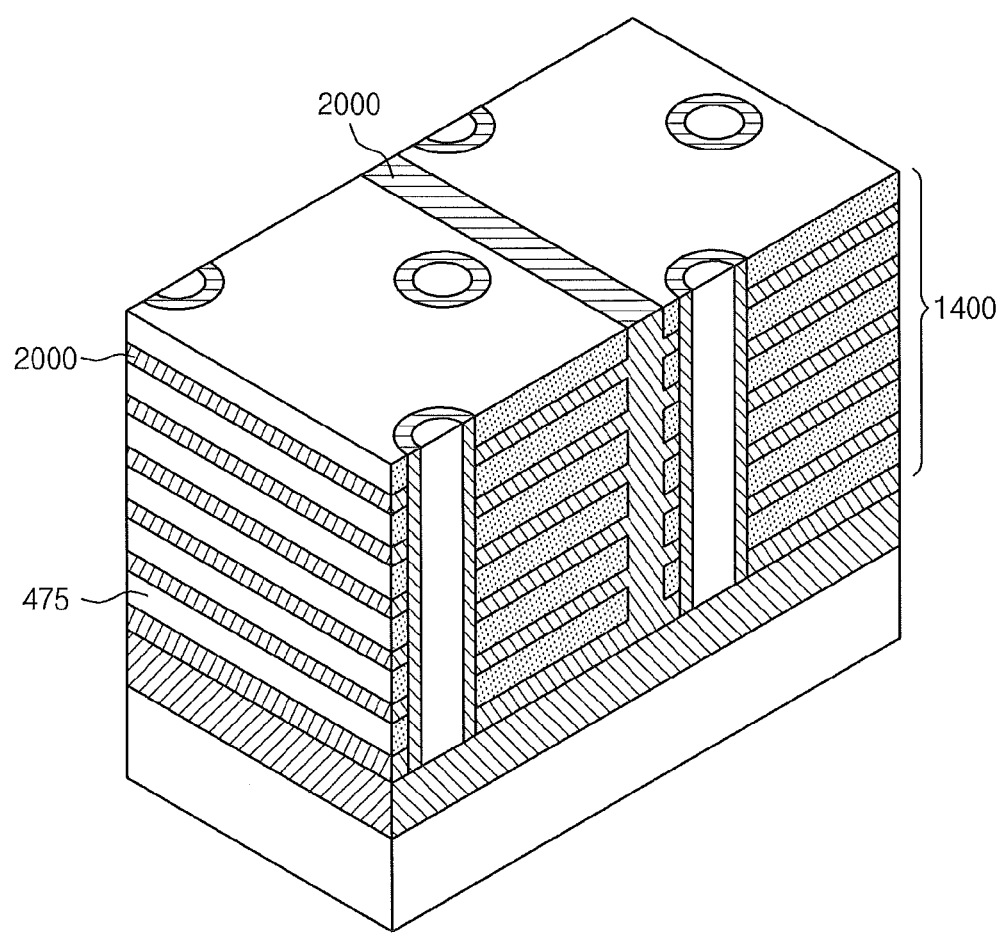
Figure 21:
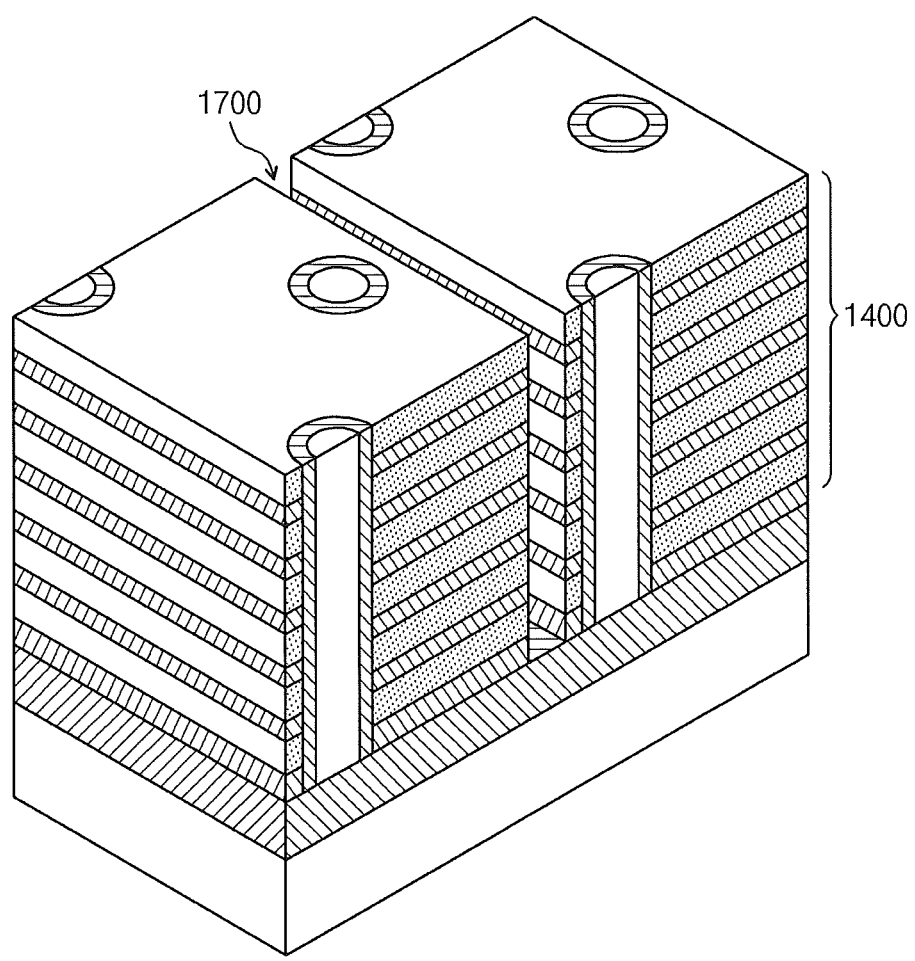

According to FIG. 17, a region between the channels is removed to form a recess 1700 so that portions of the stacked layers 1400 where the word lines (control gates) will ultimately be formed can be accessed. According to FIG. 18, a number of the stacked layers 1400 (such as those formed of SiN) can be selectively removed so that lateral recesses 1800 are provided wherein control gate structures, for example control gate of metal, will ultimately be formed. According to FIG. 19, multiple layers (such as a tunnel layer, a charge storage layer, and a blocking oxide film) are sequentially formed within the lateral recesses 1800 where the control gates will ultimately be formed. According to FIG. 20, a gate metal material 2000 is deposited in the recess 1700 between the channels as well as within the remaining voids left in the lateral recesses 1800. The gate metal material can be deposited fully or in portion so that the material can sufficiently fill lateral recess 1800. According to FIG. 21, a portion of the gate metal material 2000 is removed from the recess 1700 between adjacent channels to separate electrically the gate metal material 2000 which was deposited in the lateral recesses 1800.

Figure 22:
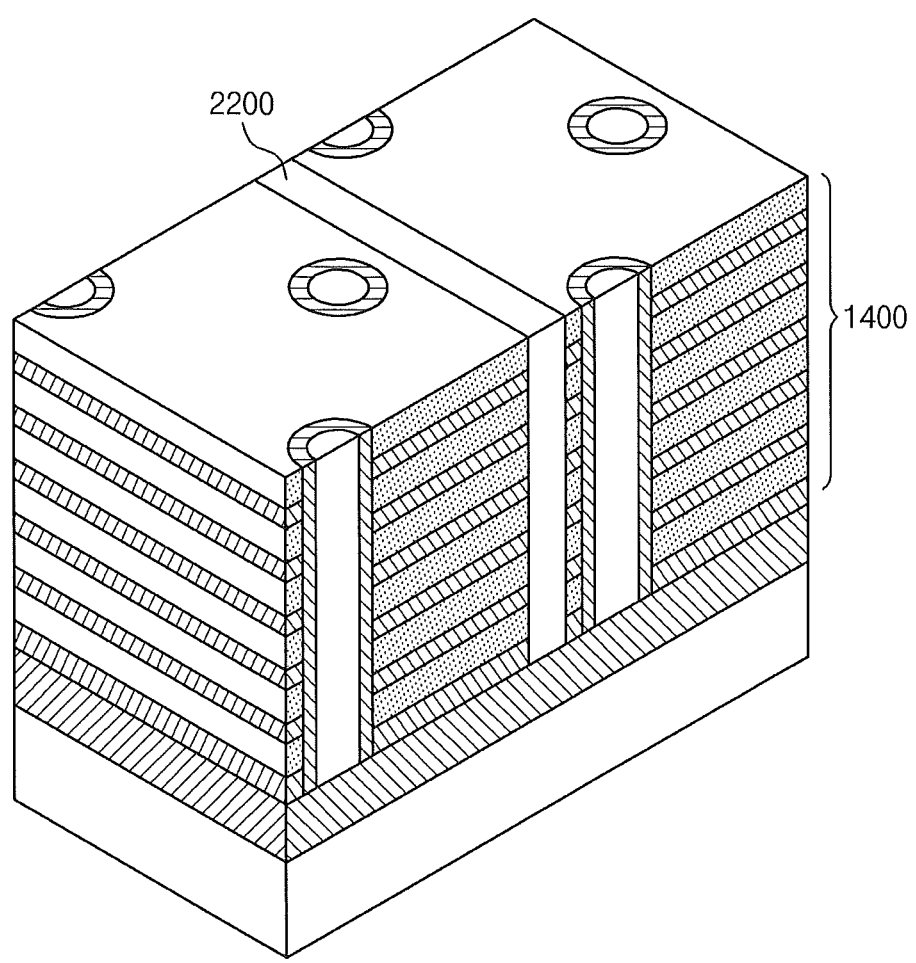

According to FIG. 22, an isolation material 2200 is deposited in the recess 1700 between the channels so that the control gates used to control immediately adjacent ones of the channels can be isolated from one another. According to FIG. 23, etching is performed to remove portions of the stacked layers 1400 to create separate split channels 2300 to provide the plurality of immediately adjacent alternatingly offset vertical NAND channel split channels in some embodiments of the inventive concept. According to FIG. 24, after forming USG on the channels and electrically connecting USG to channels, bit lines 2400 are formed extending across the channels. It will be understood that the formation of the upper select gate lines between the bit lines and the channels is not shown for simplicity.

FIGS. 24-29 are cross-sectional views that illustrate the formation of nonvolatile memory devices including a plurality of immediately adjacent alternatingly offset vertical NAND channels in some embodiments of the inventive concept. In particular, FIGS. 24-29 illustrate the formation of nonvolatile memory devices wherein control gates used to control immediately adjacent ones of the channels are not separated by an insulating material in contrast to that described above in reference to FIGS. 14-23.

Figure 24:
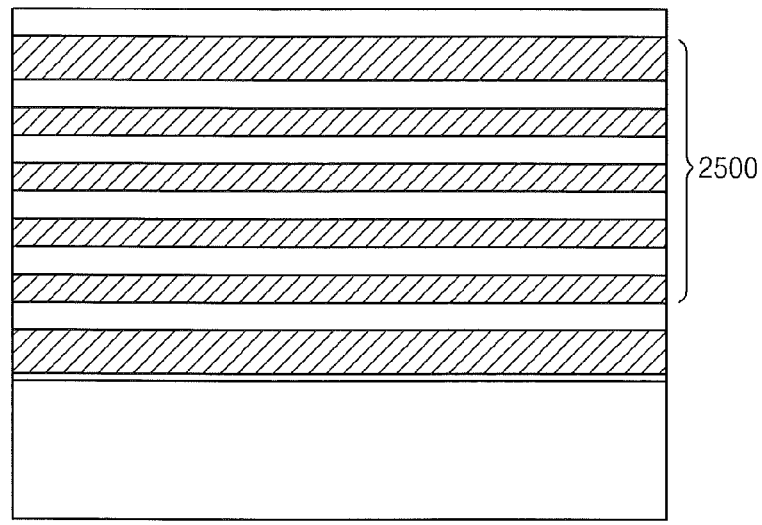
FIGS. 24-29 are cross-sectional views illustrating the formation of offset vertical NAND channels in some embodiments of the inventive concept.
Figure 25:
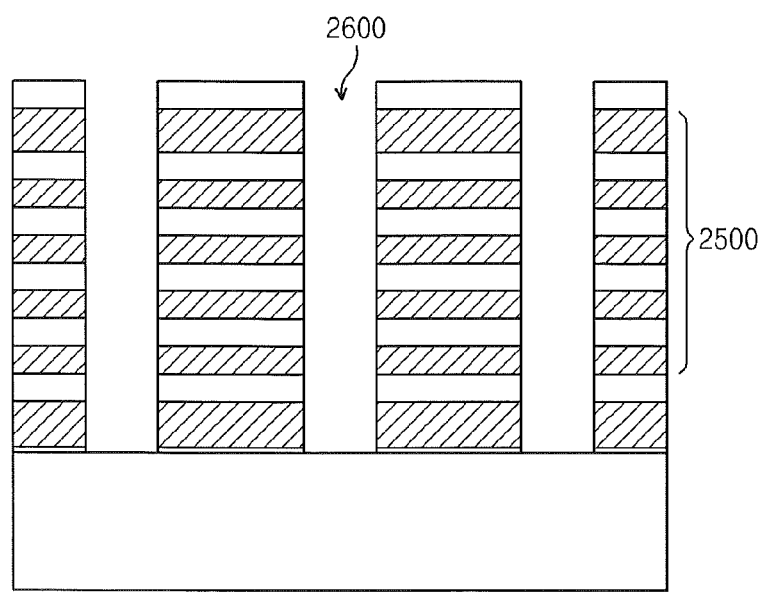
Figure 26:
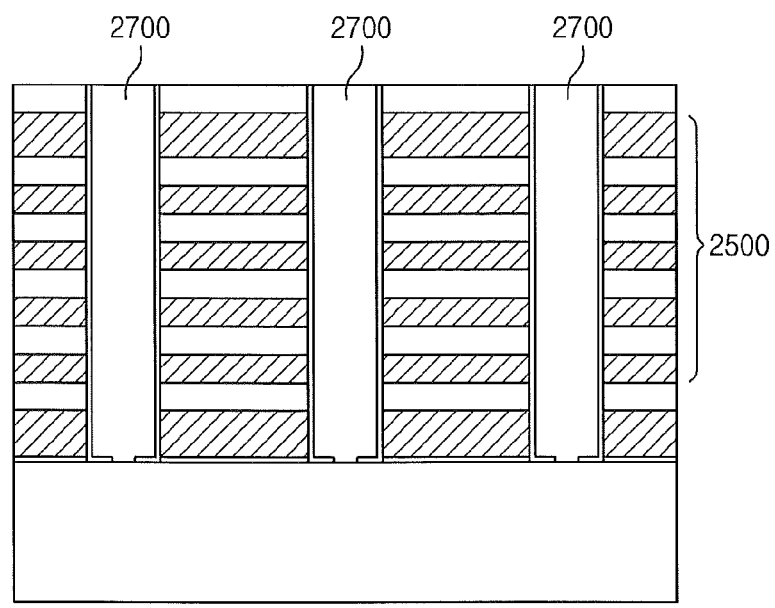

According to FIG. 24, an alternating stack of layers 2500 is formed similar to that described above in reference to FIG. 14. In contrast to the embodiments depicted in FIG. 14-23, the stack 2500 is comprised of conductive layers such as silicon and insulating layers such as silicon oxide. According to FIG. 25, portions of the stacked layers 1400 are removed to provide contacts 2600 in an offset pattern wherein the channels will ultimately be formed. According to FIG. 26, multiple layers 2700 are formed in the contacts 2600 to provide the layers between the control gates and the channel material which is formed in the contact.

Figure 27:
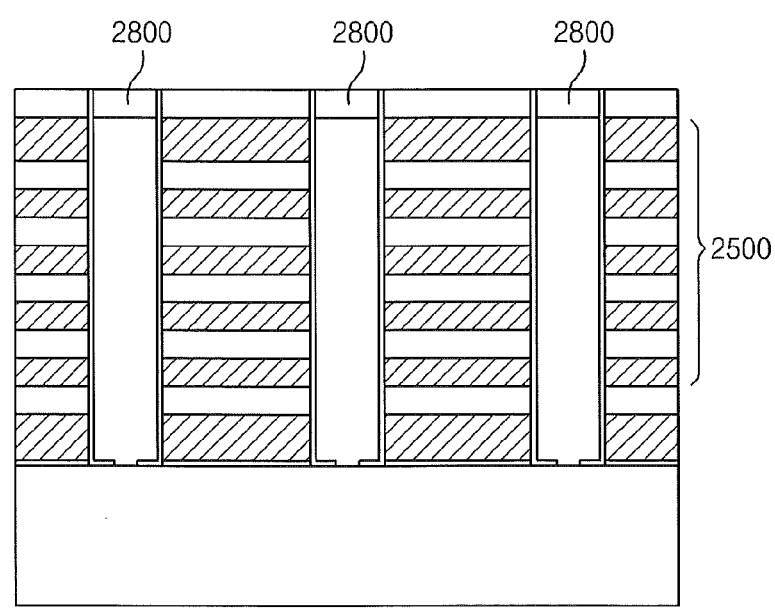
Figure 28:
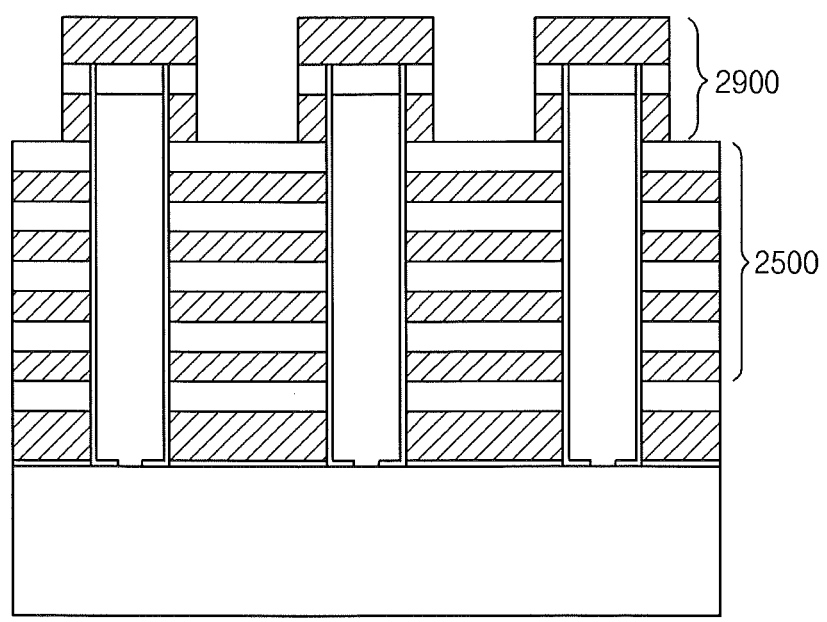

According to FIG. 27, heavy doping is provided to a layer 2800 formed above the vertical NAND channels to provide the bases for the upper select gate lines. According to FIG. 28, the upper layers 2900 of the stack are patterned to separate the upper select gate lines from one another so that they may independently control the separate channels. According to FIG. 29, the bit lines are then formed over the channel select lines and extend in a direction which is perpendicular thereto. As shown in FIG. 29, immediately adjacent ones of the vertical NAND channels are controlled by control gates defined by the alternating stacked layers 2500 which are not separated from one another. In other words, immediately adjacent ones of the channels 3000 are controlled by control gates within the stacked layers 2500 which extend between and connect to the immediately adjacent ones of the channels 300 and are therefore, not separated by an insulating material.

As described herein in greater detail, vertical NAND channels of a nonvolatile memory device can be arranged in an offset way to more closely pack the vertical NAND channels within a respective upper or lower select gate line that is used to activate those channels. For example, immediately adjacent ones of the vertical NAND channels within a particular upper select gate line can be offset from one another in the direction of the bit line that is connected to multiple upper select gate lines.

The offset of the vertical NAND channels can increase the density of the channels within the upper select gate line. For example, the offset in the bit line direction can allow the channels to be spaced closer to one another (in the upper select gate line direction) than would be possible if the vertical NAND channels were to be fully aligned in the upper select gate line direction.

Furthermore, the offset of the immediately adjacent vertical NAND channels can allow more channels to be activated by a single select gate line thereby increasing the page size and increasing the effective read/write performance of the device. In other words, increasing the page size (by packing more vertical NAND channels onto a single upper select gate line) can allow more data to be written to/read from the device during a single operation.

Further, many different patterns of the offset used for the immediately adjacent vertical NAND channels can be used to provide the advantages described above. For example, in some embodiments of the inventive concept, the plurality of immediately adjacent offset vertical NAND channels provides that two of the vertical NAND channels are offset in the bit line direction before the pattern repeats within the uppers select gate line. In still further embodiments of the inventive concept, three vertical NAND channels are offset in a bit line direction before the pattern repeats. Still further, in other embodiments of the inventive concept, four vertical NAND channels can be offset in the bit line direction before the pattern repeats in the upper select gate line. Other repeating patterns can be use.

In still further embodiments of the inventive concept, the pattern used to offset immediately adjacent ones of the vertical NAND channels can be repeated within immediately adjacent upper select gate line to provide duplicates of one another. In still further embodiments of the inventive concept, the pattern employed in one of the upper select gate lines is a mirror image of the pattern used in the immediately adjacent one of the upper select gate lines. In still other embodiments of the inventive concept, the offset vertical NAND channels can be configured according to a random pattern.

In still further embodiments of the inventive concept, the offset vertical NAND channels can be arranged within separate upper select gate lines which are paired with a single common lower select gate line. In still further embodiments of the inventive concept, the offset vertical NAND channels are coupled to separate upper select gate lines which are paired within respective separate lower select gate lines.

In still further embodiments of the inventive concept, immediately adjacent ones of the upper select gate lines (in which the offset vertical NAND channels are deployed) are themselves offset from one another in a direction of the channels. In some embodiments of the inventive concept, the immediately adjacent offset vertical NAND channels are deployed within a device wherein word lines used to program immediately adjacent vertical NAND channels are separated from one another by an insulating material. In still further embodiments of the inventive concept, the word lines used to program immediately adjacent channels are coupled to a common word line. In still further embodiments of the inventive concept, the upper select gate lines employed with the offset vertical NAND channels are inter-digitated with one another. In further embodiments of the inventive concept, upper select gate lines used to activate immediately adjacent ones of the vertical NAND channels are not interdigitated within one another.

It will be apparent to those skilled in the art that various modifications and variations can be made in the invention. Thus, it is intended that the invention covers the modifications and variations of this invention provided they come within the scope of the appended claims and their equivalents.

What is claimed:
1. A non-volatile memory device comprising:
a plurality of vertical NAND channels electrically coupled to a same single select gate line of the non-volatile memory device;
bit line contacts on the vertical NAND channels; and
a bit line electrically connected to one of the vertical NAND channels through one of the bit line contacts,
wherein the bit line contacts are coupled to the same single select gate line; and
wherein a line defined by the bit line contacts comprises at least one turn.
2. A device according to claim 1, wherein each of the vertical channels is controlled by control gates, the control gates being vertically stacked.
3. A device according to claim 2, further comprising a tunnel insulation layer, a charge storage layer, and a block insulation layer,
wherein the tunnel insulation layer, the charge storage layer, and the block insulation layer are provided between the vertical channels and the control gate.
4. A device according to claim 3, wherein at least one of the tunnel insulation layer, the charge storage layer and the block insulation layer extend onto upper and lower surfaces of the control gate.

5. A non-volatile memory device comprising:
a plurality of vertical NAND channels disposed vertically through a same single select gate line of the non-volatile memory device, the same single select gate line extending in a first direction;
bit line contacts on the vertical NAND channels;
a first bit line electrically connected to a first channel of the vertical NAND channels through a first bit line contact of the bit line contacts, the first bit line extending in a second direction; and
a second bit line electrically connected to a second channel of the vertical NAND channels through a second bit line contact of the bit line contacts, the second bit line extending in the second direction,
wherein the first bit line contact and the second bit line contact are disposed such that an imaginary line connecting a center of the first bit line contact and a center of the second bit line contact extends in a slanting direction with respect to the first direction and the second direction, the first direction and the second direction being substantially perpendicular.
6. The memory device according to claim 5, wherein each of the vertical NAND channels is controlled by control gates, the control gates being vertically stacked.
7. The memory device according to claim 6, further comprising a tunnel insulation layer, a charge storage layer, and a block insulation layer, wherein the tunnel insulation layer, the charge storage layer, and the block insulation layer are provided between each vertical NAND channel and each control gate.
8. The memory device according to claim 7, wherein at least one of the tunnel insulation layer, the charge storage layer and the block insulation layer extend onto upper and lower surfaces of each control gate.
9. The memory device according to claim 5, wherein the first bit line and the second bit line are immediately adjacent.
10. A non-volatile memory device comprising:
a plurality of vertical NAND channels disposed vertically through a same single select gate line of the non-volatile memory device, the same single select gate line extending in a first direction;
bit line contacts on the vertical NAND channels;
a first bit line contact of the bit line contacts contacting a first channel of the vertical NAND channels and a first bit line extending in a second direction;
a second bit line contact of the bit line contacts contacting a second channel of the vertical NAND channels,
wherein the first bit line contact and the second bit line contact are disposed such that an imaginary line connecting a center of the first bit line contact and a center of the second bit line contact extends in a slanting direction with respect to the first direction and the second direction, the first direction and the second direction being substantially perpendicular.
11. The memory device according to claim 10, further comprising a second bit line extending in the second direction, wherein the second bit line contact contacts the second bit line.
12. The memory device according to claim 10, wherein each of the vertical NAND channels is controlled by control gates, the control gates being vertically stacked.
13. The memory device according to claim 12, further comprising a tunnel insulation layer, a charge storage layer, and a block insulation layer, wherein the tunnel insulation layer, the charge storage layer, and the block insulation layer are provided between each vertical NAND channel and each control gate.

14. The memory device according to claim 13, wherein at least one of the tunnel insulation layer, the charge storage layer and the block insulation layer extend onto upper and lower surfaces of each control gate.

15. A non-volatile memory device comprising:
   a plurality of vertical NAND channels disposed vertically through a same single select gate line of the non-volatile memory device; and
   bit line contacts disposed on the vertical NAND channels, wherein a first group of the bit line contacts are disposed in a first row and a second group of the bit line contacts are disposed in a second row, the first and second rows are spaced apart in a column direction.

16. The memory device according to claim 15, wherein the first group of the bit line contacts is shifted from the second group of the bit line contacts in a direction of the first and second rows.

17. The memory device according to claim 15, wherein each of the vertical NAND channels is controlled by control gates, the control gates being vertically stacked.

18. The memory device according to claim 17, further comprising a tunnel insulation layer, a charge storage layer, and a block insulation layer, wherein the tunnel insulation layer, the charge storage layer, and the block insulation layer are provided between each vertical NAND channel and each control gate.

19. The memory device according to claim 18, wherein at least one of the tunnel insulation layer, the charge storage layer and the block insulation layer extend onto upper and lower surfaces of each control gate.

* * * * *